United States Patent
Chen et al.

(10) Patent No.: US 10,164,572 B2
(45) Date of Patent: Dec. 25, 2018

(54) METHOD OF MONITORING CLOCK AND OSCILLATOR MODULE THEREOF

(71) Applicant: M2Communication Inc., Hsinchu County (TW)

(72) Inventors: Yang-Wen Chen, Hsinchu County (TW); Chun-Yi Lee, Hsinchu County (TW); Derrick Wei, Hsinghu County (TW)

(73) Assignee: M2Communication Inc., Hsinchu (TW)

( * ) Notice: Subject to any disclaimer, the term of this patent is extended or adjusted under 35 U.S.C. 154(b) by 161 days.

(21) Appl. No.: 15/240,101

(22) Filed: Aug. 18, 2016

(65) Prior Publication Data

US 2018/0054163 A1    Feb. 22, 2018

(51) Int. Cl.
| | |
|---|---|
| H03B 5/32 | (2006.01) |
| H03B 5/06 | (2006.01) |
| H03L 3/00 | (2006.01) |
| H03L 5/00 | (2006.01) |
| H03K 19/20 | (2006.01) |
| H03K 3/3565 | (2006.01) |
| H03B 5/36 | (2006.01) |
| H03K 3/011 | (2006.01) |
| H03K 3/0231 | (2006.01) |

(52) U.S. Cl.
CPC ............. *H03B 5/32* (2013.01); *H03B 5/364* (2013.01); *H03K 3/011* (2013.01); *H03K 3/02315* (2013.01); *H03K 3/3565* (2013.01); *H03K 19/20* (2013.01); *H03L 3/00* (2013.01); *H03L 5/00* (2013.01); *H03B 5/06* (2013.01); *H03B 2200/0038* (2013.01); *H03B 2200/0082* (2013.01); *H03B 2200/0094* (2013.01)

(58) Field of Classification Search
CPC .. H03B 5/32; H03B 5/364; H03B 2200/0094; H03B 2201/031; H03B 5/06; H03L 3/00; H03L 5/00
See application file for complete search history.

(56) References Cited

U.S. PATENT DOCUMENTS

| | | | | |
|---|---|---|---|---|
| 8,456,243 B2* | 6/2013 | Aleman | ............ | H03B 5/36 |
| | | | | 331/16 |
| 8,816,786 B2* | 8/2014 | Tham | ............ | H03L 5/00 |
| | | | | 331/109 |
| 9,647,670 B2* | 5/2017 | Viegas | ............ | H03L 3/00 |
| 2012/0326794 A1* | 12/2012 | Kammula | ............ | H03B 5/362 |
| | | | | 331/15 |

* cited by examiner

*Primary Examiner* — Ryan Johnson
(74) *Attorney, Agent, or Firm* — Mintz Levin Cohn Ferris Glovsky and Popeo, P.C.; Peter F. Corless; Steven M. Jensen

(57) ABSTRACT

An oscillator module used with a plurality of power sources includes an oscillator unit, a clock monitor unit (CMU), a software module and a digital calibration circuit. The oscillator unit generates a clock signal. The CMU is coupled to the oscillator unit, determines whether an amplitude of the clock signal exceeds a predetermined threshold, and outputs an alarm signal if the amplitude of the clock signal is lower than the predetermined threshold. The software module is coupled to the CMU, and receives the alarm signal to output a calibration signal. The digital calibration circuit is coupled to the oscillator and the software module, and outputs a control signal in response to the clock signal and the calibration signal, adjusting the plurality of power sources to modify the clock signal.

13 Claims, 21 Drawing Sheets

METHOD OF MONITORING CLOCK AND OSCILLATOR MODULE THEREOF

TECHNICAL FIELD

Embodiments of the present disclosure are related to an oscillator module, and more particularly to the oscillator module monitoring a clock signal in low power and method of calibration thereof.

BACKGROUND

The electronic device can include a "working-usually" device and a "standby-often" device. For examples, a mobile device is a working-usually device and an Internet of Things (IoT) device is a standby-often device. The IoT may include a smart gate lock, window security device and health care device, a smart watch, a smart ring and so on. If the IoT device needs to change battery every one or two weeks, that does not make sense. The major concern of the electronic device is about the power consumption and the battery life thereof. The power management can improve the chip's power efficiency so as to prolong the battery life and the operating time.

An electronic device requires an oscillator to provide with a clock to maintain its function, even if the electronic device is in an idle state, it still needs clock to let the entire system of the electronic device be monitored. Temperature, process variation of different lot of wafer, and capacitor loading may affect a workable clock of the oscillator, so the clock needs to be calibrated.

Although the electronic device is designed to have low power consumption, it still needs power to support a standby mode in order that it wakes up to function normally, therefore the calibration of the clock powered by a power source in the idle mode plays an important role for saving power. Please refer to FIG. 1, which shows power consumption in the different applications in the prior art. The horizontal axis represents time and the vertical axis represents a power consumption. The illustration in Application I shows a timing diagram regarding to the power consumption in the mobile device, and the illustration in Application II shows a timing diagram regarding to the power consumption in the IoT device. In FIG. 1, the mobile device and the IoT device respectively have periods t_prid1 and t_prid2 which can be the same, the active time t_act of the IoT device is relatively shorter than that of the mobile device, typically about a time level from milli-seconds to a few seconds, and there is lower power consumption to be made because the duration of the active time t_act is relatively short. However, the sleep time t_sleep of the IoT device is relatively longer than that of the mobile device, typically about a time level of days, therefore a power source reduction of driving the clock can contribute a lot for power saving and prolong the battery life further. For example, it may reach to a goal of ten-year battery life of the IoT device.

Please refer to FIG. 2, which shows a conventional clock calibration circuit 10. The conventional clock calibration circuit 10 includes a power source 101, an inverting amplifier 102, a crystal resonator 104, load capacitors C1 and C2, and an analog amplitude calibration circuit 103. The analog amplitude calibration circuit 10 includes a peak detector 1031, a capacitor C3 and a comparator 1032. The power source 101 provides enough current to the inverting amplifier 102, and the amplifier 102, in response to the current provided from the power source 101, inverts a phase of a clock CK1 signal generating from the crystal resonator 104, and outputs a clock signal CK2 to the peak detector 1031. The peak detector 1031 can be implemented by a differential amplifier or alike.

Please refer to FIG. 3, which shows the peak detector 1031 implemented 1033 in the prior art. The peak detector 1033 may include two transistors M1, M2, which are coupled in parallel, and coupled to the capacitor C3 and a resistor R0. The differential amplifier 1033 receives complementary signals Vin+ and Vin− to output an envelope signal Senv. For example, clock signals CK1 and CK2 are inputted into gate terminals of the two transistors M1 and M2 respectively. The envelope signal Senv of the peak detector 1031 is shown in FIG. 4. The voltage waveform way of the envelope signal Senv is tooth-like. Capacitor C3 is charged when either Vin+ or Vin− approach their maximum peak value while it is discharged via R0 when Vin+ and Vin− close to their average value. This continuous charging and discharging on C3 creates an average voltage Vavg on C3 which is directly proportional to the input amplitude of Vin+ or Vin−. The comparator 1032 compares the average voltage Vavg with a reference voltage Vref to output a feedback signal Sfb to adjust the power source 101. The reference voltage Vref needs to be set to assure that the power source 101 provides enough current to the inverting amplifier 102 in order to support the clock signals CK1 and CK2 to work normally. In order to let the clock signals CK1 and CK2 work normally, the amplitude of which is about 200~300 mV typically.

Please refer back to FIG. 2, while the analog amplitude calibration circuit 103 is powered, a quiescent current flowing therein makes power consumption; and the IoT device often include at least one of a conventional clock calibration circuit 10, so that the total power consumption is relatively large. The quiescent current in the analog amplitude calibration circuit 103 consumes 1~5 uA of the quiescent current typically, and it will consume a large amount of power as long as the idle mode keeps a long period, therefore the structure in the analog amplitude calibration circuit 103 is not suitable for the IoT device at a low power condition. In addition, if the frequency of the clock signal CK1, CK2 is relative low, for example typical 32 kHz, then a time constant of capacitor C3 will be large, which causes a large-capacity on-chip capacitor C3 to occupy large chip area. In addition, in order to generate the reference voltage Vref, there is a need to add other peripheral circuit, which results in relative large power consumption.

On the other hand, some factors can affect the clock signals CK1, CK2 of the crystal resonator 104. They include temperature, humidity, voltage/current sparks, process variation, capacitor loading, so the clock signals CK1, CK2 need to be calibrated for accuracy demanding applications.

Furthermore, saving the chip area and saving the power consumption are also expected. Accordingly, there is a need for a method and a module to reduce the power consumption, simultaneously calibrate the clock signal to run in an economical power and keep it in a relatively stable state, and have an economical chip area.

In addition, it is expected that the clock signal is always monitored and can be optimized to save power and be calibrated automatically whenever it is abnormal.

SUMMARY OF EXEMPLARY EMBODIMENTS

In accordance with one embodiment of the present disclosure, an oscillator module is provided. The oscillator module used with a plurality of power sources, comprising an oscillator unit, a clock monitor unit (CMU), a software module and a digital calibration circuit. The oscillator unit generates a clock signal. The CMU is coupled to the oscillator unit, determines whether an amplitude of the clock signal exceeds a predetermined threshold, and outputs an alarm signal if the amplitude of the clock signal is lower than the predetermined threshold. The software module is coupled to the CMU, and receives the alarm signal to output a calibration signal. The digital calibration circuit is coupled to the oscillator and the software module, outputs a control signal in response to the clock signal and the calibration signal, adjusts the plurality of power sources to modify the clock signal.

In accordance with a further embodiment of the present disclosure, the present invention provides an oscillator module. The oscillator module comprises an oscillator unit and a digitized circuit. The oscillator unit generates a clock signal. The digitized circuit is coupled to the oscillator unit and digitally detects whether the clock signal is normal, wherein if the clock signal is normal, the digitized circuit idles itself; and if not, the digitized circuit is activated digitally.

In accordance with one embodiment of the present disclosure, an oscillator module is provided. The oscillator module comprises an oscillator unit and a digitized circuit. The oscillator unit generates a clock signal. The digitized circuit digitally detecting whether the clock signal is normal, wherein if the clock signal is normal, the digitized circuit idles itself and the oscillator module monitors whether the clock signal remains normal.

The above embodiments and advantages of the present invention will become more readily apparent to those ordinarily skilled in the art after reviewing the following detailed descriptions and accompanying drawings.

BRIEF DESCRIPTION OF THE DRAWINGS

FIG. 7($b$) shows a timing diagram of input and output signals of the FSM unit according to the first preferred embodiment of the present disclosure;

FIG. 16($b$) shows an inverting amplifier according to a preferred embodiment of the present disclosure;

DETAILED DESCRIPTION OF THE PREFERRED EMBODIMENTS

Figure 1:
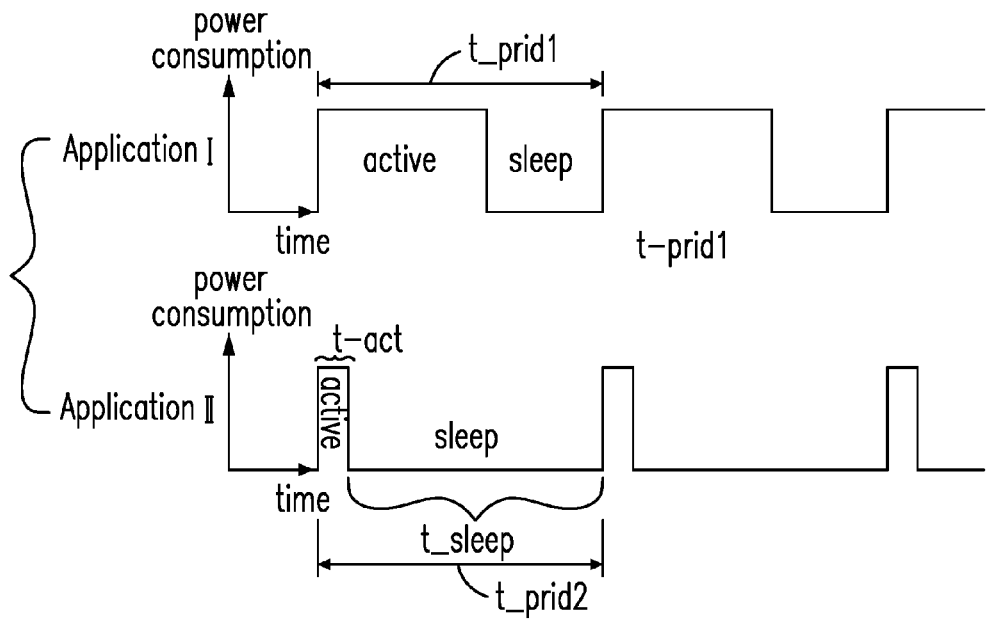
FIG. 1 shows power consumption in the different applications in the prior art.
Figure 2:
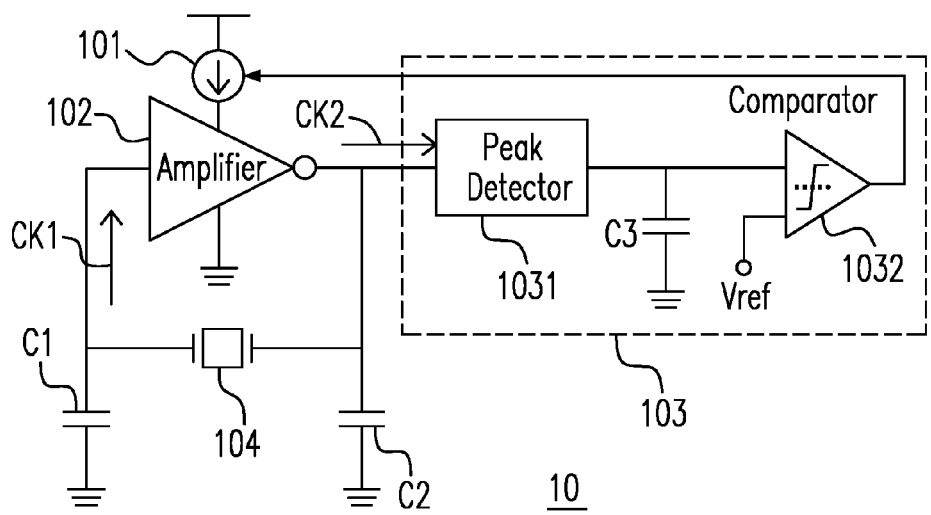
FIG. 2 shows a conventional clock calibration circuit.
Figure 3:
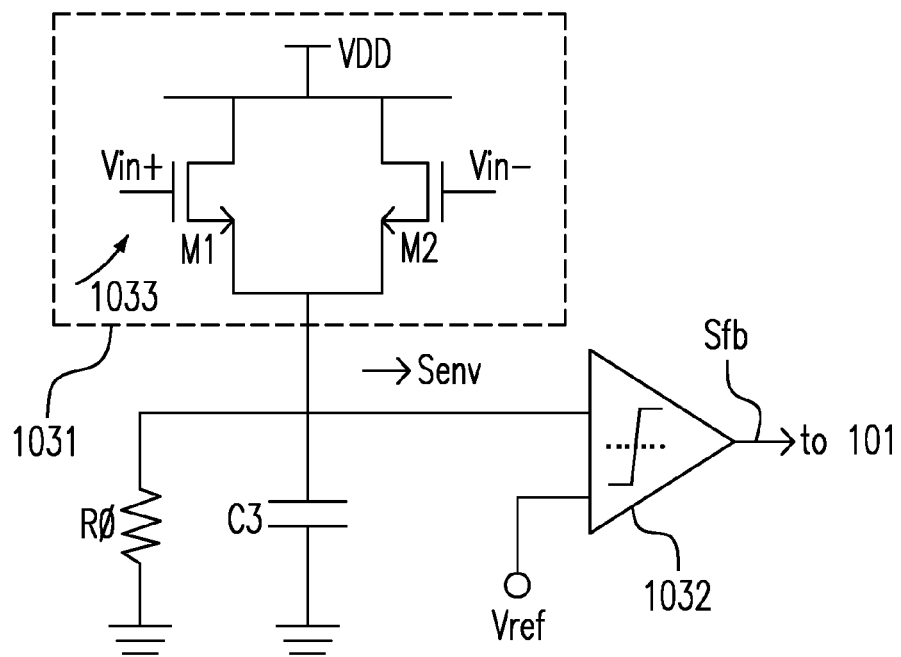
FIG. 3 shows a peak detector implemented by a differential amplifier in the prior art.
Figure 4:
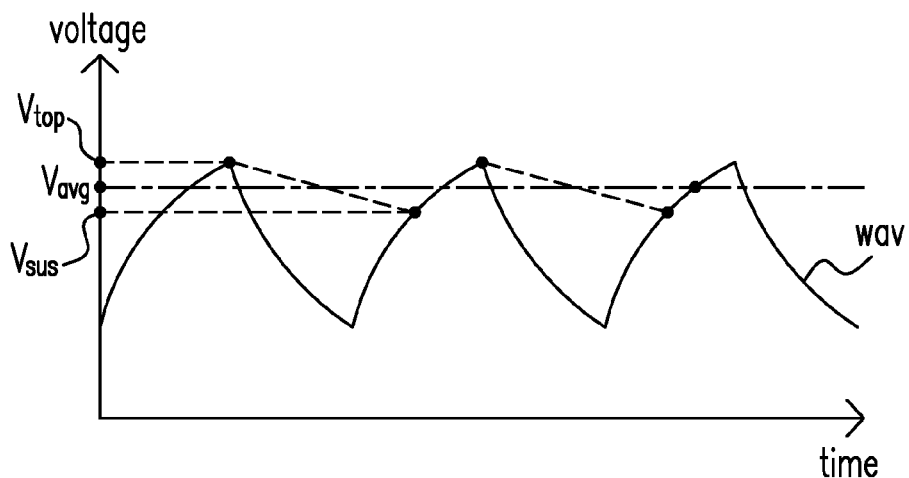
FIG. 4 shows an envelope signal of the peak detector in the prior art.
Figure 5:
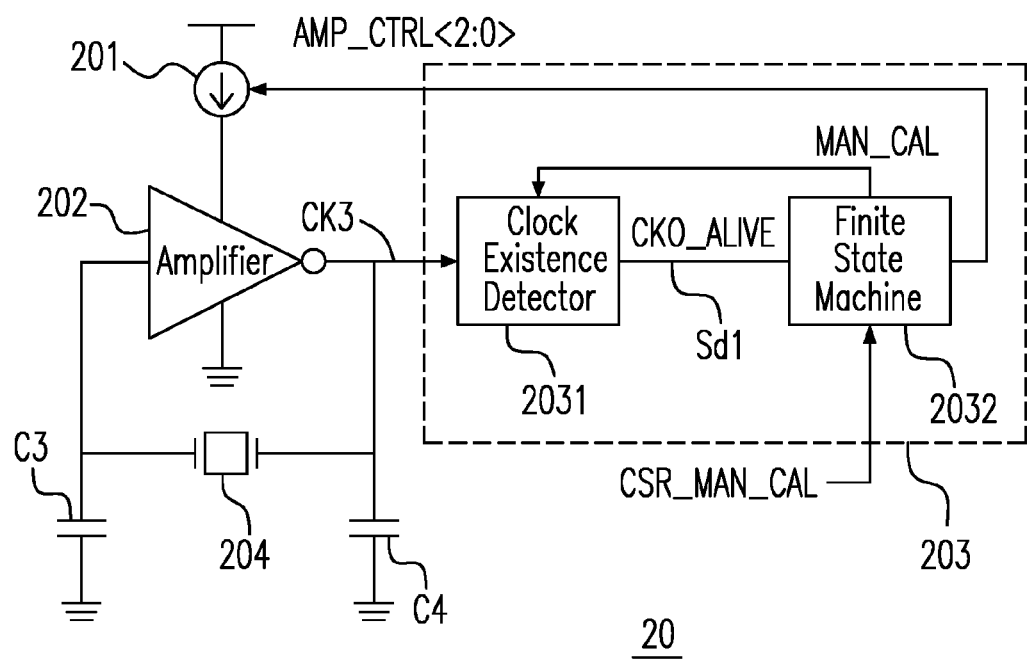
FIG. 5 shows a clock calibration module according to a first preferred embodiment of the present disclosure.

Please refer to FIG. 5, which shows a clock calibration module 20 according to a first preferred embodiment of the present disclosure. In FIG. 5, the clock calibration module 20 includes a plurality of power sources 201, an inverting amplifier 202, a resonator 204, load capacitors C3 and C4, and a digital amplitude calibration module 203. The digital amplitude calibration module 203 includes a clock existence detector (CED) 2031 and a finite state machine (FSM) unit 2032. The plurality of control signals AMP_CTRL <2:0> together with decoder (not shown) controls the plurality of power sources 201 to provide the inverting amplifier 202 with a suitable current, the inverting amplifier 202 drives the resonator 204 to output a clock signal CK3 to the CED 2031, and the CED 2031 detects whether the clock signal CK3 is normal or is acceptable. The plurality of control signals AMP_CTRL <2:0> can be a single control signal depending on the number of power source applied. When the clock signal CK3 is normal, the CED 2031 outputs a data signal Sd1 indicating a message CKO_ALIVE which shows the clock signal CK3 is alive. The finite state machine 2032 takes some proper measurements accordingly in response to receiving the data signal Sd1. The plurality of control signals AMP_CTRL <2:0> together with decoder indicates that eight power sources can be controlled, and the number of the control signal depends on the demand that the resonator 204 can start up the clock signal CK3 normally. The manual calibration signal CSR_MAN_CAL can trigger the FSM unit 2032 to start a calibration process. The FSM unit 2032 can be constructed by a circuit synthesized by electronic design automation (EDA) tools, such as the synopsis and the like, a circuit designer can use a hardware description language (HDL) to build the circuit, such as the verilog HDL, the VHDL, or the like.

Figure 6:
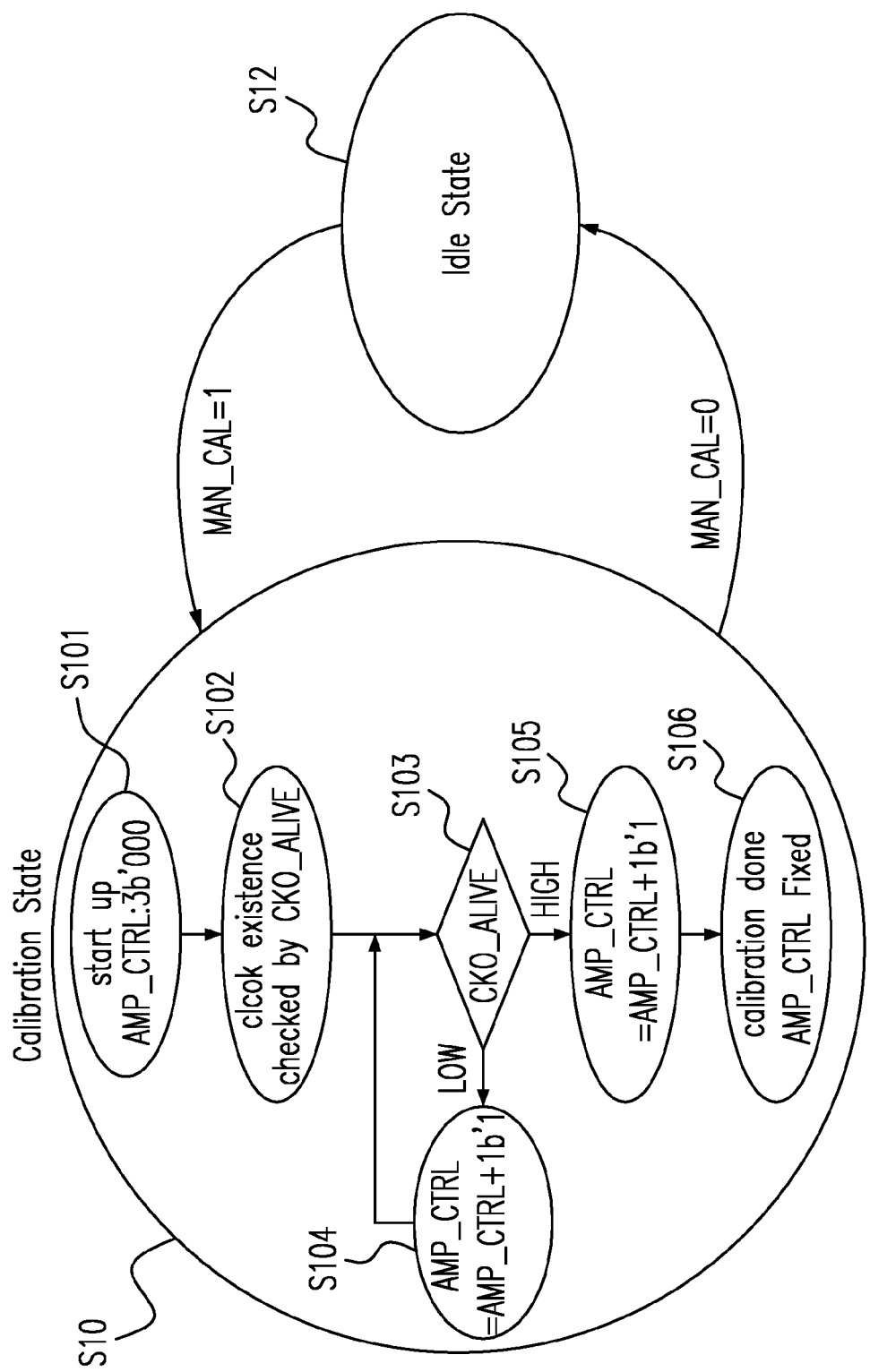
FIG. 6 shows a finite state machine (FSM) state diagram of an FSM unit according to the first preferred embodiment of the present disclosure.

Please refer to FIG. 6, which shows the FSM state diagram of the FSM unit 2032 according to the first preferred embodiment of the present disclosure. The FSM state diagram includes a calibration state S10 and an idle state S12. In some embodiments, when the manual calibration signal CSR_MAN_CAL is in a low level state, the FSM unit 2032 enters into the idle state S12, and once the manual calibration signal CSR_MAN_CAL becomes in a high level state, the FSM unit 2032 enters into the calibration state S10. For some reasons whenever the clock signal CK3 is abnormal, the manual calibration signal CSR_MAN_CAL can be operated by a user or by a software, even by an alarm triggered due to a detection of attenuation of the clock signal CK3.

Figure 7A:
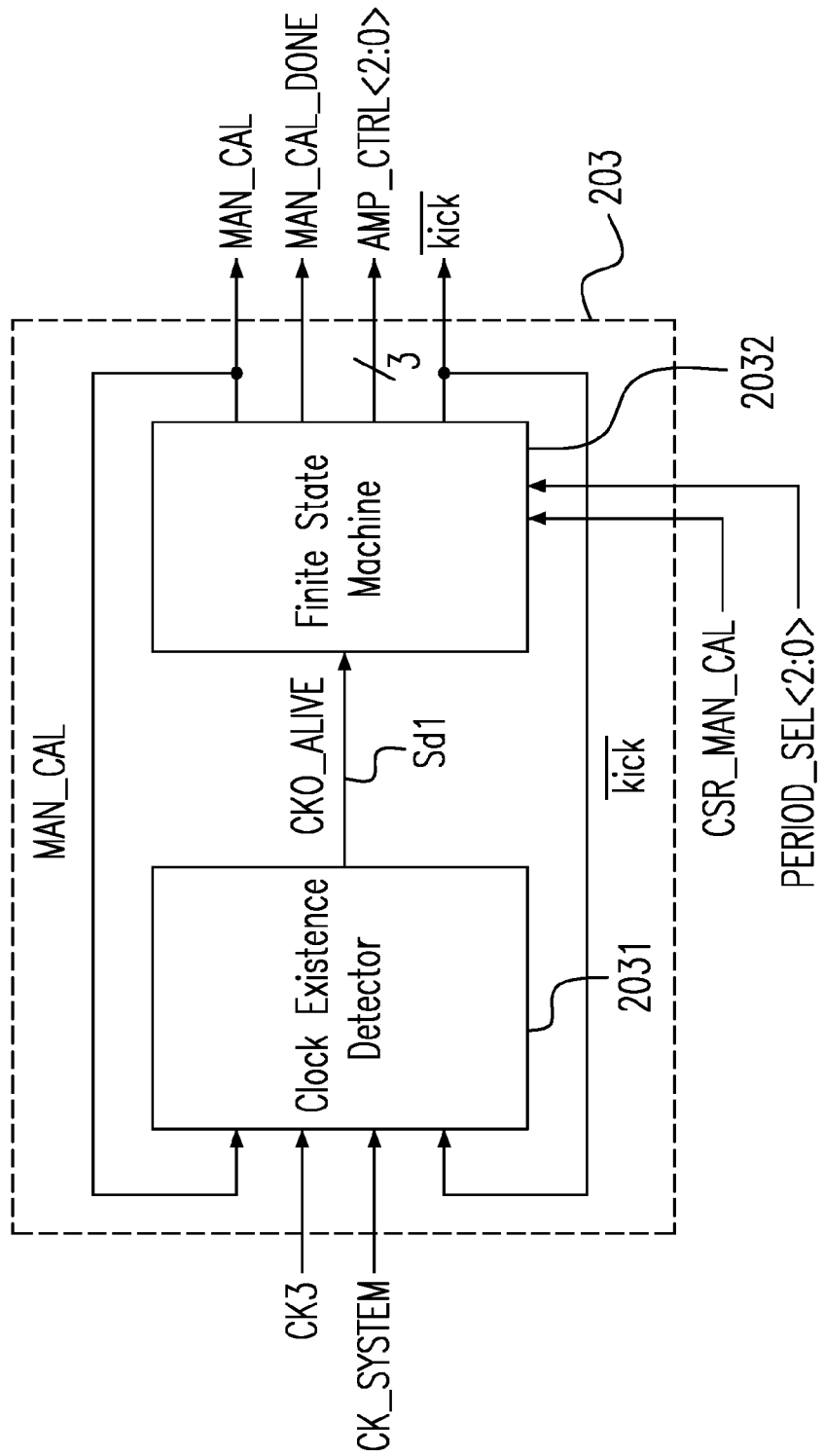
FIG. 7($a$) shows the digital amplitude calibration module.
Figure 7B:
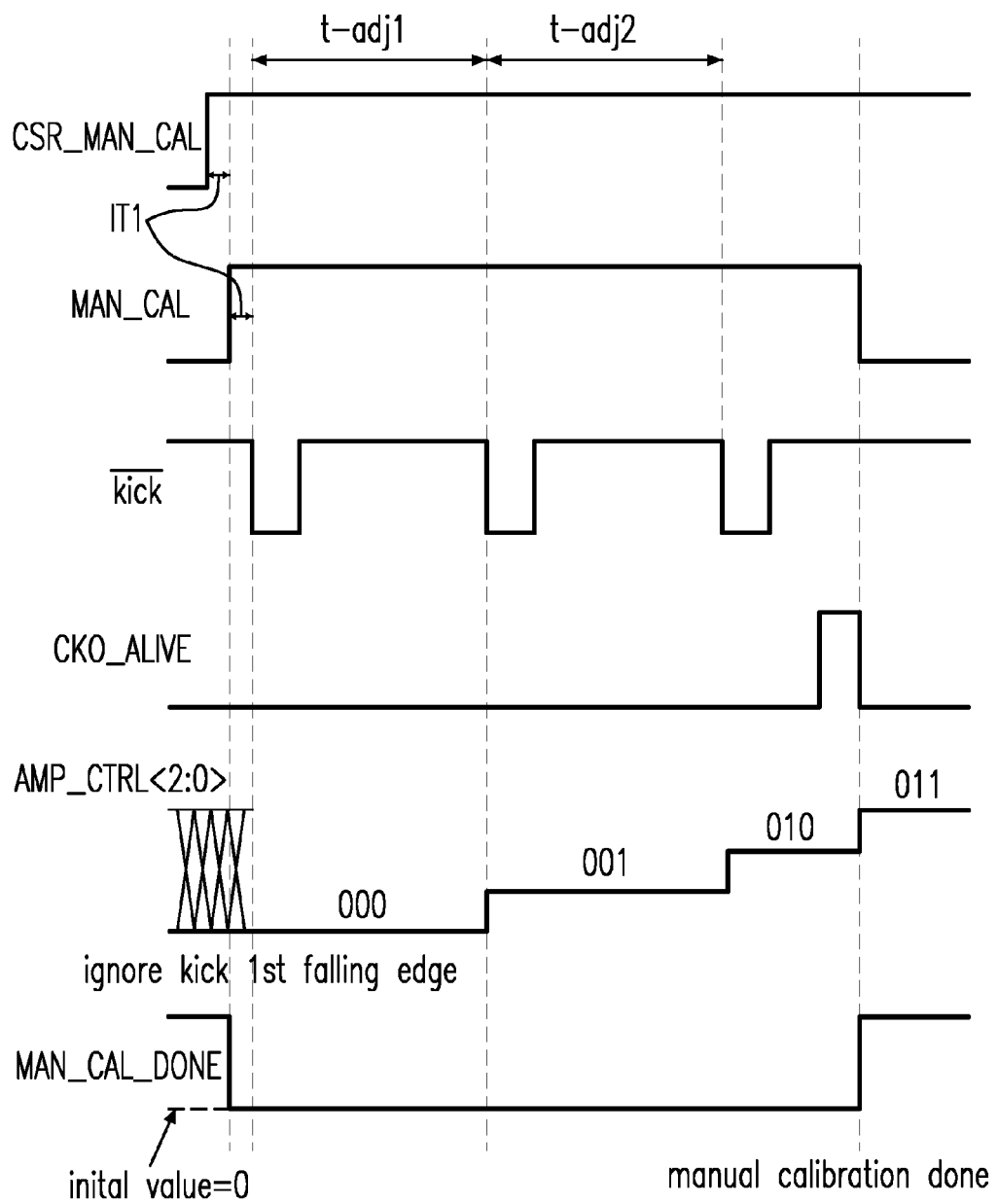

Please refer to FIG. 7(a), which shows the digital amplitude calibration module 203, and please refer to FIG. 7(b), which shows a timing diagram of input and output signals of the FSM unit 2032 according to the first preferred embodiment of the present disclosure. Please refer to FIGS. 6, 7(a) and 7(b). In FIG. 6, in the state S101, the calibration process starts up, and the plurality of control signals AMP_CTRL <2:0> are set to zero for all bits, it shows zero power in FIG. 7(b) during a first cycle time t_adj1, which is a predetermined period of time and depends on the CED 2031. The power can be provided in the form of a plurality of current sources or a plurality of voltage sources. When the manual calibration signal CSR_MAN_CAL is in a high level state, the calibration signal MAN_CAL is changed from a low level state to a high level state after one period 1T1, the calibration complete signal MAN_CAL_DONE is changed from a high level state to a low level state, and the FSM unit 2032 outputs a kick signal kick_bar to the resonator 204, then the FSM unit 2032 starts to monitor the message CKO_ALIVE. The kick signal kick_bar can give the resonator 204 an instant clock boost to help the clock signal CK3 swing further. In FIG. 6, in the state S102, the CED 2031 monitors the message CKO_ALIVE and the clock signal CK3 is checked by using the message CKO_ALIVE. In the state S103 it is decided whether the message CKO_ALIVE indicating the status of the clock signal CK3 is high. If the message CKO_ALIVE shows a low level state, it indicates the clock signal CK3 is not normal, and additional power is necessary to drive, so the calibration process is configured to have a state S104. In FIGS. 6 7(a) and 7(b), in the state S104, the plurality of control signals AMP_CTRL <2:0> digitally adjust the plurality of power source 201 by elevating one step, i.e., from three binary bits "000" to "001", it shows one additional step power is accumulated as in FIG. 7(b) during a second cycle time t_adj2 being equal to the first cycle time t_adj1, and the FSM unit 2032 outputs the kick signal kick_bar to the resonator 204. If the message CKO_ALIVE shows a high level state, the FSM unit 2032 outputs a reset signal (not shown) to let the CED 2031 output the message CKO_ALIVE showing a low level state again, and the calibration process is configured to have a state S105. In the state S105, the same way as performed in the state S104 adjusts power by elevating one step. This is because some factors including temperature, process variation, humidity can affect the frequency or the amplitude of the clock signal CK3, therefore in order to guarantee the clock signal CK3 can swing and function normally within the variety of condition, it is reasonable to elevate power by one step. In some embodiments, because the message CKO_ALIVE has shown a high level state, it indicates that the clock signal CK3 swings sufficiently to work normally, so the FSM unit 2032 keeps the plurality of control signals AMP_CTRL <2:0>, and don't need to digitally adjusts the plurality of power source 201 by elevating one step, in other words, the state S105 can be omitted.

Please refer to FIGS. 6, 7(a) and 7(b), when the message CKO_ALIVE shows a low level state again, the calibration signal MAN_CAL provided from the FSM unit 2032 to the CED 2031 is changed to be in a low level state, which idles all the operations of detecting the clock signal CK3 regardless it is normal or abnormal. Meanwhile, the calibration complete signal MAN_CAL_DONE provided from the FSM unit 2032 goes to be in a high level state again, and indicates that the calibration process is done and the FSM unit 2032 enters the idle state S12.

When the FSM unit 2032 enters the idle state S12, it also disables the CED 2031. In addition, the CED 2031 and the FSM unit 2032 are all digital devices, so there is almost no power to waste during the idle state S12. The digital amplitude calibration module 203 has the advantage of saving power because it is only active during the calibration process and otherwise is idle, thus the whole digital structure of the digital amplitude calibration module 203 consumes very low power which almost can be neglected. Unlike the analog amplitude calibration circuit 103, it still consumes relatively large static current as time goes, even if it is not active.

Figure 8:
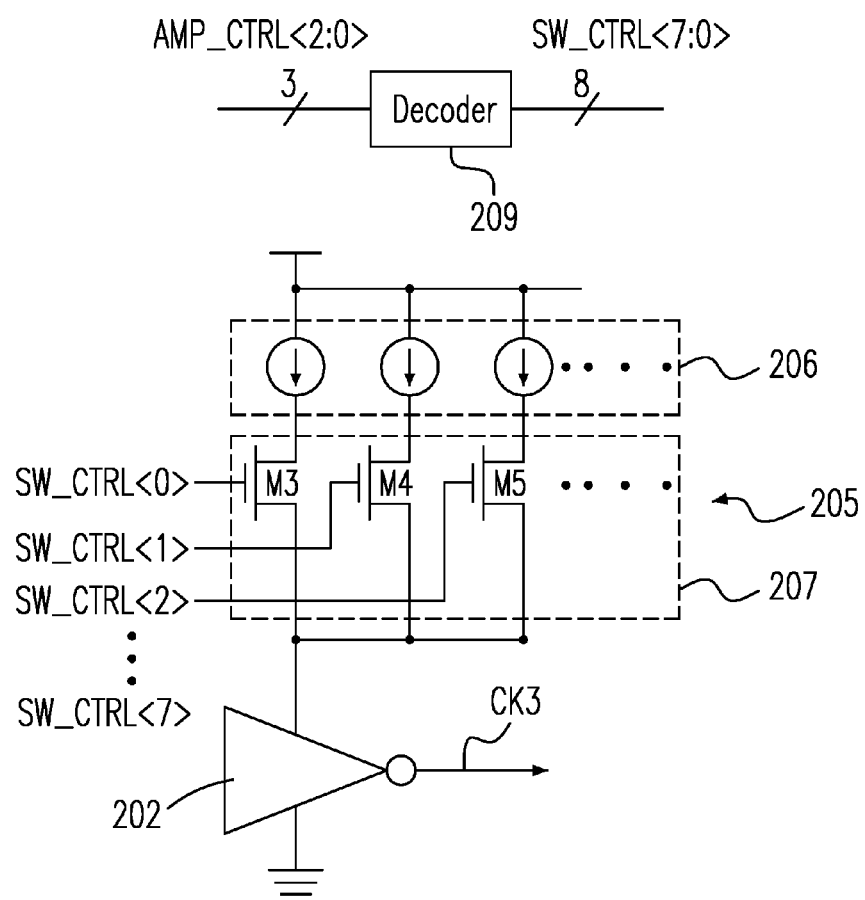
FIG. 8 shows a plurality of power sources according to the first preferred embodiment of the present disclosure.

Please refer to FIG. 8, which shows the plurality of power sources 201 according to the first preferred embodiment of the present disclosure. The plurality of power sources 201 include a digitalized current supply unit 205, wherein the digitalized current supply 205 includes a plurality of current sources 206 and a plurality of MOS switches 207 controlled by the plurality of control signals SW_CTRL0, SW_CTRL1, SW_CTRL2 . . . SW_CTRL7 respectively. Each of the plurality of MOS switches 207 has a source terminal coupled to each of the plurality of current source 206 respectively, and has a drain terminal which is all coupled to the inverting amplifier 202, wherein each of the plurality of MOS switches 207 has the same ratio of channel width to channel length.

In some embodiment, there can be only one current source, and each of the plurality of MOS switches 207 has the source terminal coupled to the current source, and has the drain terminal which is all coupled to the inverting amplifier 202, wherein each of the plurality of MOS switches 207 has the different ratio of channel width to channel length.

Figure 9:
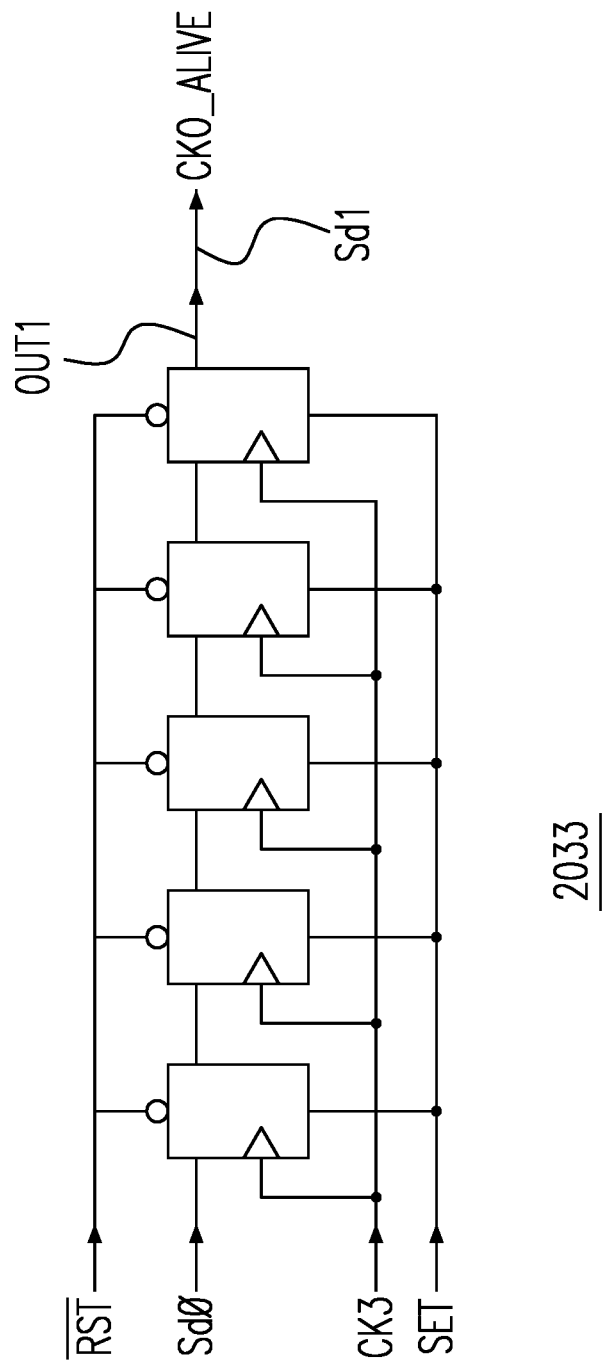
FIG. 9 shows an implementation circuit of a CED in detail according to the second preferred embodiment of the present disclosure.

Please refer to FIG. 9, which shows an implementation circuit of the CED 2031 in detail according to the second preferred embodiment of the present disclosure. The CED 2031 is implemented by a shift register 2033, has an output OUT1, and receives a data signal Sd0 and the clock signal CK3 is powered by the inverting amplifier 202 and at least one of the plurality of power sources 201. Please refer to FIGS. 5 and 9, the state machine unit 2032 detects whether the output OUT1 has the data signal Sd0 within a predetermined period of time, wherein if the output OUT1 has the data signal Sd0 within the predetermined period of time, the state machine unit 2032 keeps the clock signal CK3 powered by the at least one of the plurality of power sources 201; and if not, the state machine unit 2032 additionally powers the clock signal CK3 by another one of the plurality of power sources.

In FIG. 9, in some embodiments, the reset signal RST_bar, the set signal SET and the data signal Sd0 are provided from the FSM unit 2032, and the clock signal CK3 provided from the resonator 204 needed to be checked. When the FSM unit 2032 is in the idle state S12, the data signal Sd0, the reset signal RST_bar and the set signal SET are always in low level states. When the FSM unit 2032 is in the calibration state S10, the data signal Sd0 goes to be in a high level state, the reset signal RST_bar goes to be in a high level state to release all the individual registers, and the set signal SET keeps the low level state. The calibration signal MAN_CAL in FIG. 7 can be used to the reset signal RST_bar in FIG. 9. If the clock signal CK3 works normally, the shift register 2033 passes the data signal Sd0 to the output OUT1 when the amplitude of the plurality of power sources is large enough to shift the data signal Sd0 to the output OUT1 within the predetermined period of time. Unlike the conventional peak detector 1031, there is no need to care whether the amplitude of the clock signal CK3 swings sufficiently, the only thing needs to be checked is whether the output OUT1 has the data signal Sd0 within the predetermined period of time, or in other point of view, the shift register 2033 starts to detect the data signal Sd0 at the output OUT1 within the predetermined period of time when the reset signal RST_bar being in a high level state is received by the shift register 2033. When the clock signal CK3 is detected, it is necessary to make sure that the clock signal CK3 is stable, thus the predetermined period of time is required. The number of the shift register 2033 can be used to determine the predetermined period of time. In some embodiments, a clock divider receiving the clock signal CK3 may be arranged prior to the shift register 2033, and the shift register 2033 can be replaced by only one register. For example, a 1/32 clock divider together with only one register can output the data signal Sd0 after the predetermined period of time.

In some embodiments, when the shift register 2033 is operated in a "SET" scenario and the FSM unit 2032 is in the idle state S12, the set signal SET is always in a high level state, the reset signal RST_bar is in a low level state, and the data signal Sd0 is always in a low level state. The inverse of the calibration signal MAN_CAL in FIG. 7(b) is used to be the set signal SET when the shift register 2033 is operated in the SET scenario. Once the FSM unit 2032 enters the calibration state S10 by manually triggering, the set signal SET goes to be in a low level state, the reset signal RST_bar keeps the low level state, thus the data signal Sd0 passes through the registers sequentially and is shifted to the output OUT1. The FSM unit 2032 will detect the output OUT1 having a level state changed from a high level state to a low level state, which indicates the clock signal CK3 is normal. After the FSM unit 2032 detects this data transition within the predetermined period of time starting from a start time that a level state of the set signal SET is changed from a high level state to a low level state, the FSM unit 2032 controls the level state of the set signal SET to be changed from the low level state to a high level state to deactivate the shift register 2033, and the FSM unit 2032 itself is back to be in the idle state S12. By this all digitized module and method of calibrating the clock signal CK3, the power consumption is almost zero in the idle state S12, which can prolong the battery life of the IoT device to ten years. Even if the FSM unit 2032 is in the calibration state S10, the all digitized module in a relative low frequency clock can also consume very few power compared with the conventional analog calibration circuit.

Figure 10:
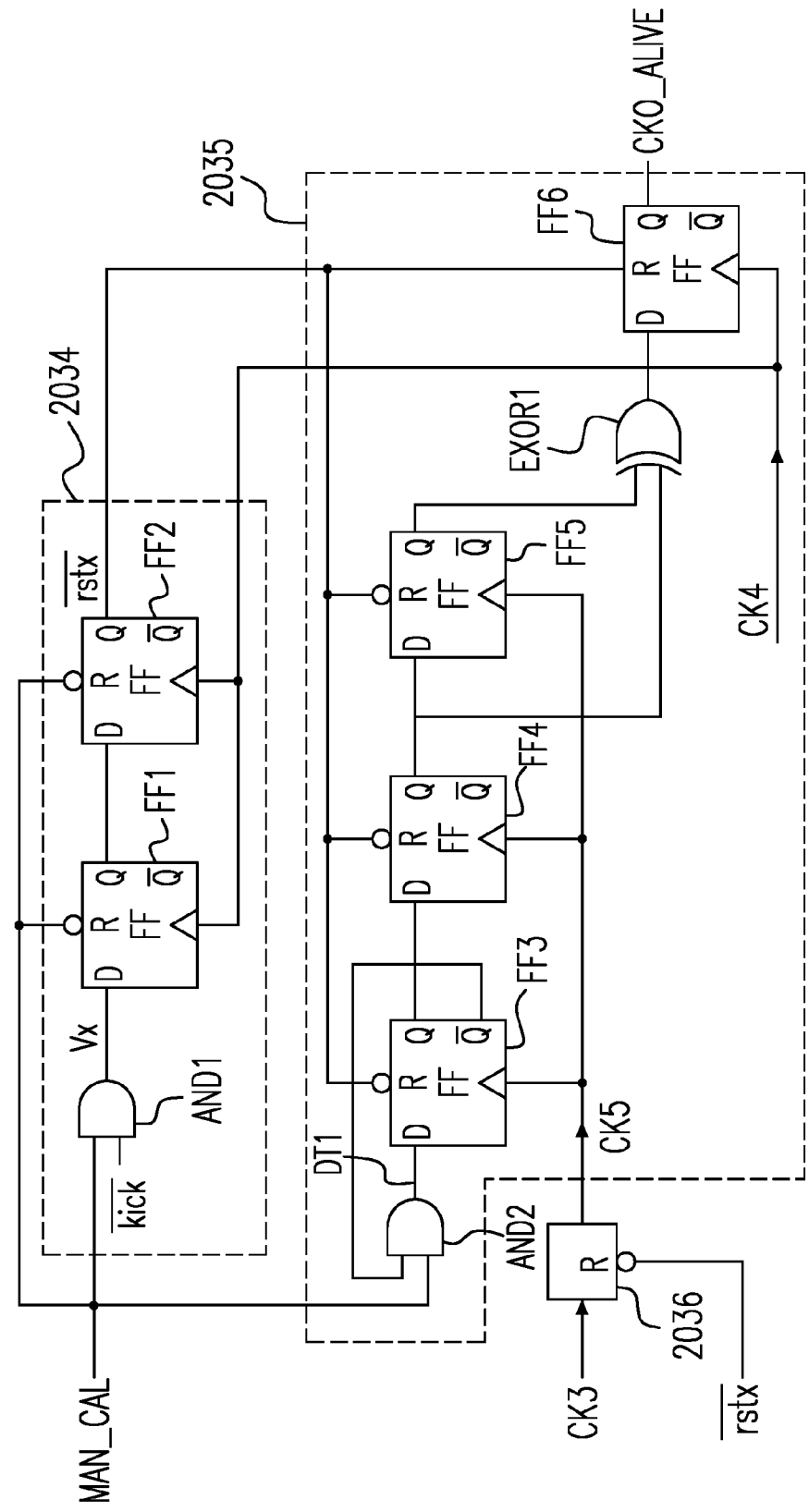
FIG. 10 shows an implementation circuit of the CED in detail according to the third preferred embodiment of the present disclosure.

Please refer to FIG. 10, which shows an implementation circuit of the CED 2031 in detail according to the third preferred embodiment of the present disclosure. The CED 2031 is implemented by two shift register 2034, 2035 and a clock divider 2036. The shift register 2034 includes an AND gate AND1, and flip flops FF1 and FF2 coupled serially and electrically, and is used to reset the clock divider 2036 and the shift register 2035 by outputting the reset signal rstx_bar to the clock divider 2036 and each R terminal of flip flops FF3, FF4, FF5 and FF6. Even when the kick signal kick_bar kick_bar and the calibration signal MAN_CAL are in high level states, the data Vx and the reset signal rstx_bar will become in high level states to allow data Vx and DT1 to be delivered. The clock divider 2036 divides the frequency of the clock signal CK3 to provide the clock signal CK5 to each clock input of the flip flops FF3, FF4 and FF5. The shift register 2035 includes an AND gate AND2, the flip flops FF3, FF4 and FF5 connected serially, and an EXCLUSIVE OR gate EXOR1 coupled serially and electrically between the flip flop FF6 and the flip flop FF5. The shift register 2035 is used to detect whether the clock signal CK3 is normal. The shift register 2034 is operated by another clock source CK4 from a system. The clock signal CK3 is also used to be the system clock as soon as it is normal, so it is beneficial to switch between them in case one of them is down.

Please refer to FIGS. 6, 7(a), 7(b) and 10, when the FSM unit 2032 is in the idle state S12 in FIG. 6, the calibration signal MAN_CAL being not on duty is in a low level state, and the flip flops FF1, FF2 are all reset to be in a low level state at each output terminal Q, and it results in resetting the flip flops FF3, FF4, FF5 to be in a low level state at each output terminal Q.

When the manual calibration signal CSR_MAN_CAL is triggered by a software or a user, the FSM unit 2032 starts the calibration process, the calibration signal MAN_CAL becomes in a high level state, the reset signal rstx_bar provided from the output terminal Q of the flip flop FF2 becomes in a high level state, and it allows the data DT1 to be transmitted through the flip flops FF3, FF4 and FF5. The output terminal Q_bar is connected back to the AND gate AND2, used to construct a T type flip flop, thus the skilled person knows that the T type flip flop outputs a flip data continuously, such as "0101 . . . ". The flip data will be triggered by using the normal clock signal CK3 to pass through flip flops FF4 and FF5, and because two input terminals of the EXCLUSIVE OR gate EXOR1 are electrically connected to an input data terminal and an output terminal Q of the flip flop FF5 respectively, the flip data of the present clock and the flip data of the next clock must be complementary, causing the EXCLUSIVE OR gate EXOR1 to change its output data from "0" in the idle state S12 to "1", then the clock signal CK4 triggers flip flop FF6 to send the message CKO_ALIVE indicating the clock signal CK3 is normal in the next cycle as shown in the timing diagram in FIG. 7. Once the FSM unit 2032 finds that the clock signal CK3 is normal, it controls the calibration signal MAN_CAL to be back in the idle state S12, for example, to become in a low level state in this instance. Then all the outputs of flip flops FF1, FF2, FF3, FF4, FF5 and FF6, and the data Vx become in low level states, and the data Vx and DT1 won't be delivered.

Figure 11:
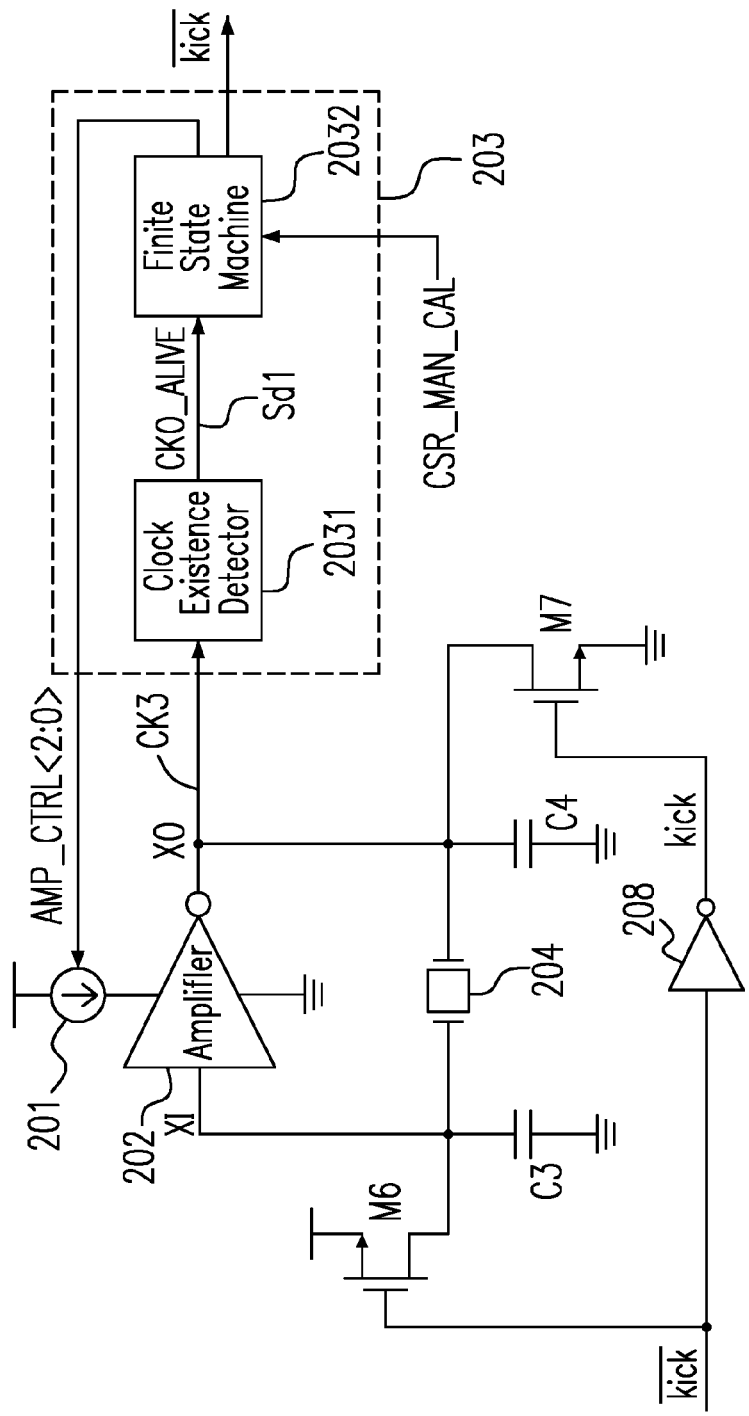
FIG. 11 shows a kick signal boosting the clock signal of a clock calibration module according to the preferred embodiment of the present disclosure.

Please refer to FIG. 11, which shows a kick signal boosting the clock signal CK3 of a clock calibration module 22 according to the preferred embodiment of the present disclosure. FIG. 11 is similar to FIG. 5, but the only difference is three components added. They are PMOS M6 and NMOS M7 coupling to the resonator 204 and inverter 208. The inverter 208 inverts the kick signal kick_bar, and the two kick signals kick_bar and kick couple to the gates of PMOS M6 and NMOS M7 respectively. The two kick signals kick_bar and kick give the resonator 204 an instant clock boost to help the clock signal CK3 swing further. The PMOS transistor M6 and the NMOS transistor M7 are electrically coupled to terminal XI and XO of the resonator 204 respectively, and the inverting gate 208 is coupled to each gate of PMOS transistor M6 and NMOS transistor M7 respectively. Please refer to FIGS. 7 and 11, when the FSM unit 2032 does not find any change at the message CKO_ALIVE during the first cycle time t_adj1, the FSM unit 2032 controls the kick signal kick_bar to become in a low level state, the PMOS transistor M6 conducts to charge the capacitor C3, the NMOS transistor M7 conducts to discharge the capacitor C4, and the clock signal CK3 is boosted accordingly.

Figure 12:
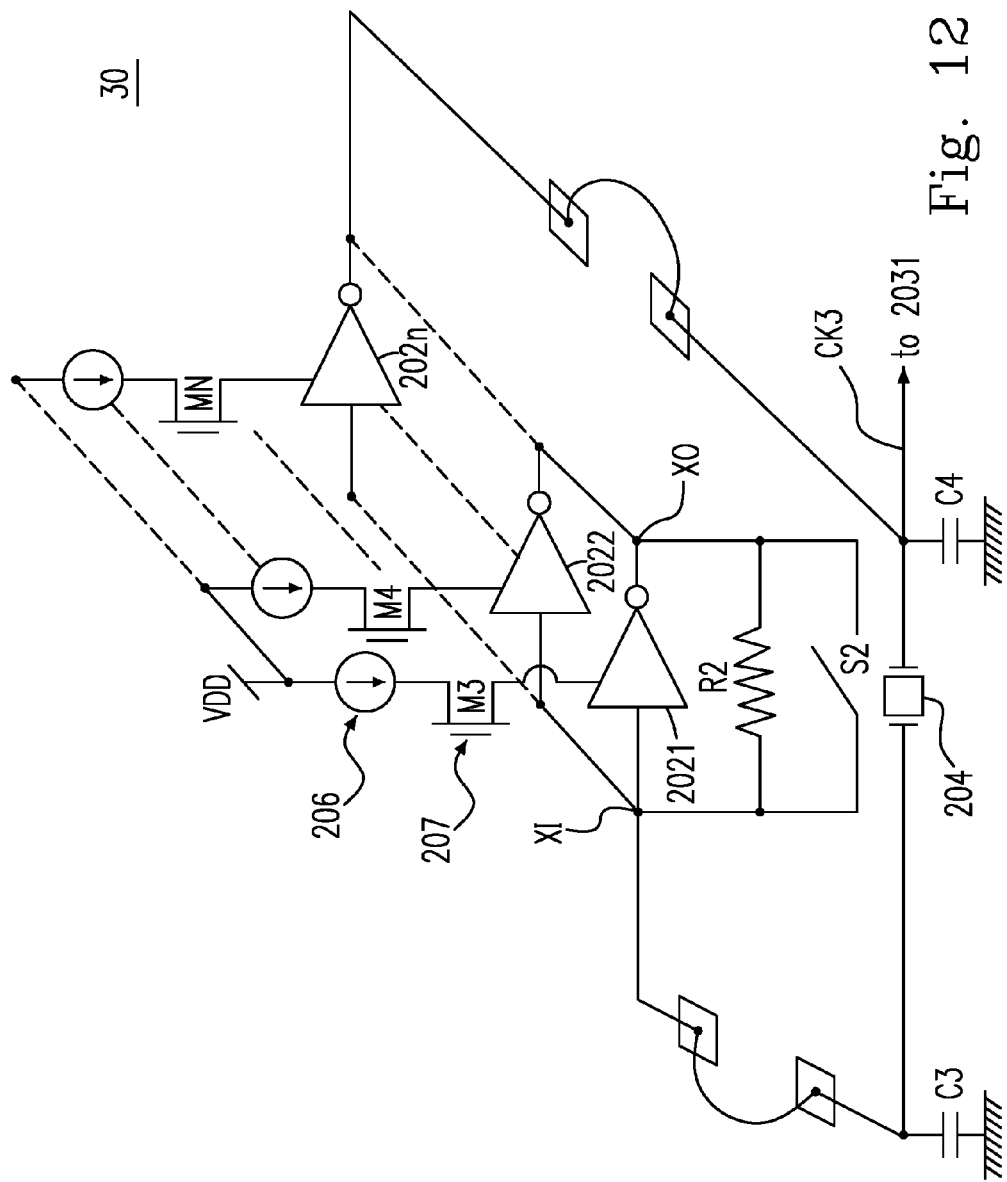
FIG. 12 shows a driving circuit according to the preferred embodiment of the present disclosure.

Please refer to FIG. 12, which shows a driving circuit 30 according to the preferred embodiment of the present disclosure. The driving circuit 30 includes the digitalized current supply unit 205 including the plurality of current sources 206 and the plurality of MOS switches 207 controlled by the plurality of control signals, the inverting amplifier 202 including an array of amplifiers 2021, 2022 . . . , 202n. Each current source is electrically connected to a source terminal of each MOS switch, each amplifier 2012, 2022 . . . , 202n is coupled to a drain terminal of each MOS switch. The amplifier 2021 is coupled to the resistor R2 and the switch S2 in parallel. When the power is on, the switch S2 is conducted, thus the array of amplifiers 2021, 2022 . . . , 202n has a relatively small gain After a startup time t_startup, the switch S2 is open to cut off, the resistor R2 is incorporated into a feedback loop of the amplifier 2021, so the gain becomes relatively large.

Figure 13:
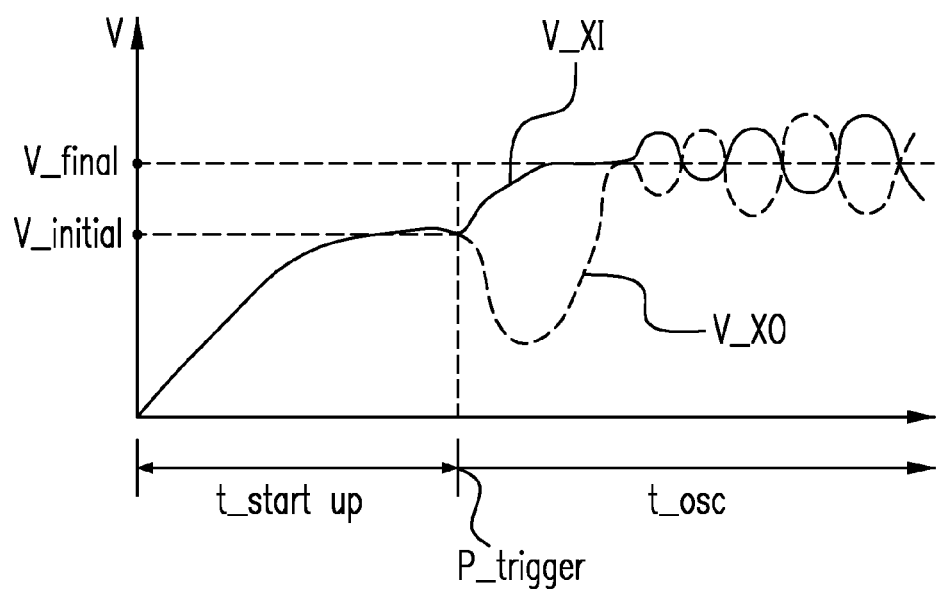
FIG. 13 shows waveforms of the clock signal when it is initialized.

Please refer to FIG. 13, which shows waveforms of the clock signal CK3 when it is initialized. The horizontal axis represents time, and the vertical axis represents voltage when the clock signal is initialized. The dash curve line shows a waveform V_XO of the point XO, and the solid curve line shows a waveform V_XI of the point XI. Please refer to FIGS. 12 and 13, during the start up time t_startup, the voltage of the point XI reaches to the initial voltage V_initial very quickly because the gain is small. After the start up time, at the time of the trigger point P_trigger, the gain becomes relatively large because the resistor R2 is incorporated, the operating point of the array of the amplifiers 2021, 2022 . . . , 202n shifts to increase its internal voltage and current, causing an oscillation boost at the points XI and XO, then the signal clock begins to oscillate continuously and steadily during the period t_osc. In some embodiments, during the start up time t_startup, the plurality of MOS switches 207 are all conducted, thus currents of the plurality of current sources are all flooded to the array of amplifiers 2021, 2012, . . . , 202n respectively. In this embodiment, an initializing calibration process is reversed compared with the calibration process as in FIG. 7.

Figure 14:
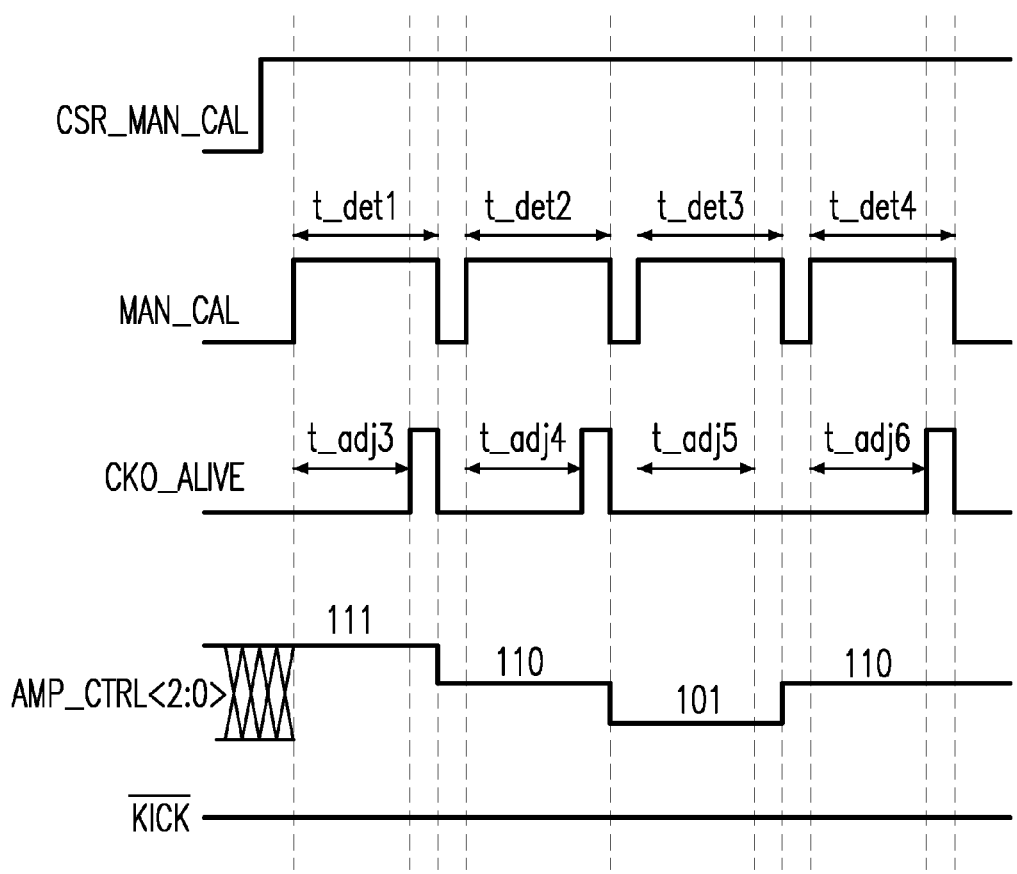
FIG. 14 shows a timing diagram of decreased power controlled by the FSM unit according to the preferred embodiment of the present disclosure.

Please refer to FIG. 14, which shows a timing diagram of decreased power controlled by the FSM unit 2032 according to the preferred embodiment of the present disclosure. In FIG. 14, the manual calibration signal CSR_MAN_CAL can be controlled by a software, for example, when the power is on, the initializing calibration process begins, the software is configured to set the level state of the manual calibration signal CSR_MAN_CAL from a low level state to a high level state. The kick signal KICK_bar is always in a high level state. After one period 1T1, the level state of the calibration signal MAN_CAL is changed from a low level state to a high level state and a first detection cycle t_det1 begins. Please refer to FIGS. 5, 8, 10 and 14, the plurality of control signals AMP_CTRL <2:0> are set to a three-binary-bit value being equal to "111", which indicates all the MOS switches 205 in FIG. 8 are conducted. The shift register 2035 in FIG. 10 begins to detect whether the message CKO_ALIVE indicates that the clock signal CK3 is normal within a predetermined period of time, and if the message shows a high level state after the first period of time t_adj3, the calibration signal MAN_CAL will be in a low level state to reset all the flip flops FF1, FF2, FF3, FF4, FF5 and FF6, thus the message CKO_ALIVE becomes in a low level state in order to start a second detection cycle t_det2. Meanwhile, the plurality of control signals AMP_CTRL <2:0> will be set to a three-binary-bit value "110", indicating the current provided by the plurality of power sources 206 is decreased by one step. Then the level state of the calibration signal is changed from the low level state to a high level state again in order to start another detection cycle.

In FIG. 14, the second detection cycle t_det2 starts at the beginning of the second period of time t_adj4, which is the time when the level state of the calibration signal MAN_CAL is changed from the low level state to the high level state. The second period of time t_adj4 as well as the first period of time t_adj3 is related to the CED 2031. For example, if a more steady clock detection is required, the clock divider 2036 of the CED 2031 in FIG. 10 can be designed as a 1/64 clock divider, it means that the message CKO_ALIVE shows a high level state after at least 64 consecutive clock cycle of the clock signal CK3 to make sure that the clock signal CK3 is stable and there is no fault detection happened. In this case, both periods of time t_adj4 and t_adj3 become longer. If the message still shows the clock signal CK3 is normal, it indicates the current provided by the plurality of power sources 206 can be decreased by one step to save power, the plurality of control signals AMP_CTRL <2:0> will be set to a three-binary-bit value "101" at the time when the level state of the calibration signal MAN_CAL is changed from the high level state to a low level state, and a third detection cycle t_dec3 continues.

In FIG. 14, if the message CKO_ALIVE does not show the clock signal CK3 is normal within the predetermined period of time, i.e., the message CKO_ALIVE is in a high level state, later at the end of the third detection cycle t_det3, the FSM unit 2032 detects there is no level transition of the message CKO_ALIVE, thus the FSM unit 2032 knows that the current provided by the plurality of power sources is not sufficient to support the clock signal CK3, so the FSM unit 2032 controls the plurality of control signals AMP_CTRL <2:0> to increase the current outputted from the plurality of power sources 206 by one step. At the end of the third detection cycle t_det3, the plurality of control signals AMP_CTRL <2:0> are set to a three-binary-bit value being equal to "110" by the FSM unit 2032.

Similarly, the fourth detection cycle t_det4 starts at the beginning of the period of time t_adj6, and ends at the time when the level state of the calibration signal MAN_CAL is from the high level state to a low level state. During the fourth detection cycle t_det4, if the FSM unit 2032 detects that the message CKO_ALIVE does show the clock signal CK3 is normal after the period of time t_adj6, i.e., the message CKO_ALIVE is in a high level state, later at the end of the fourth detection cycle t_det4, the FSM unit 2032 determines to end this initializing calibration process and controls the level state of the calibration signal to be changed from the high level state to a low level state, thus the message CKO_ALIVE goes to be in a low level state, the plurality of control signals AMP_CTRL <2:0> are fixed, and the FSM 2032 enters the idle state.

Figure 15:
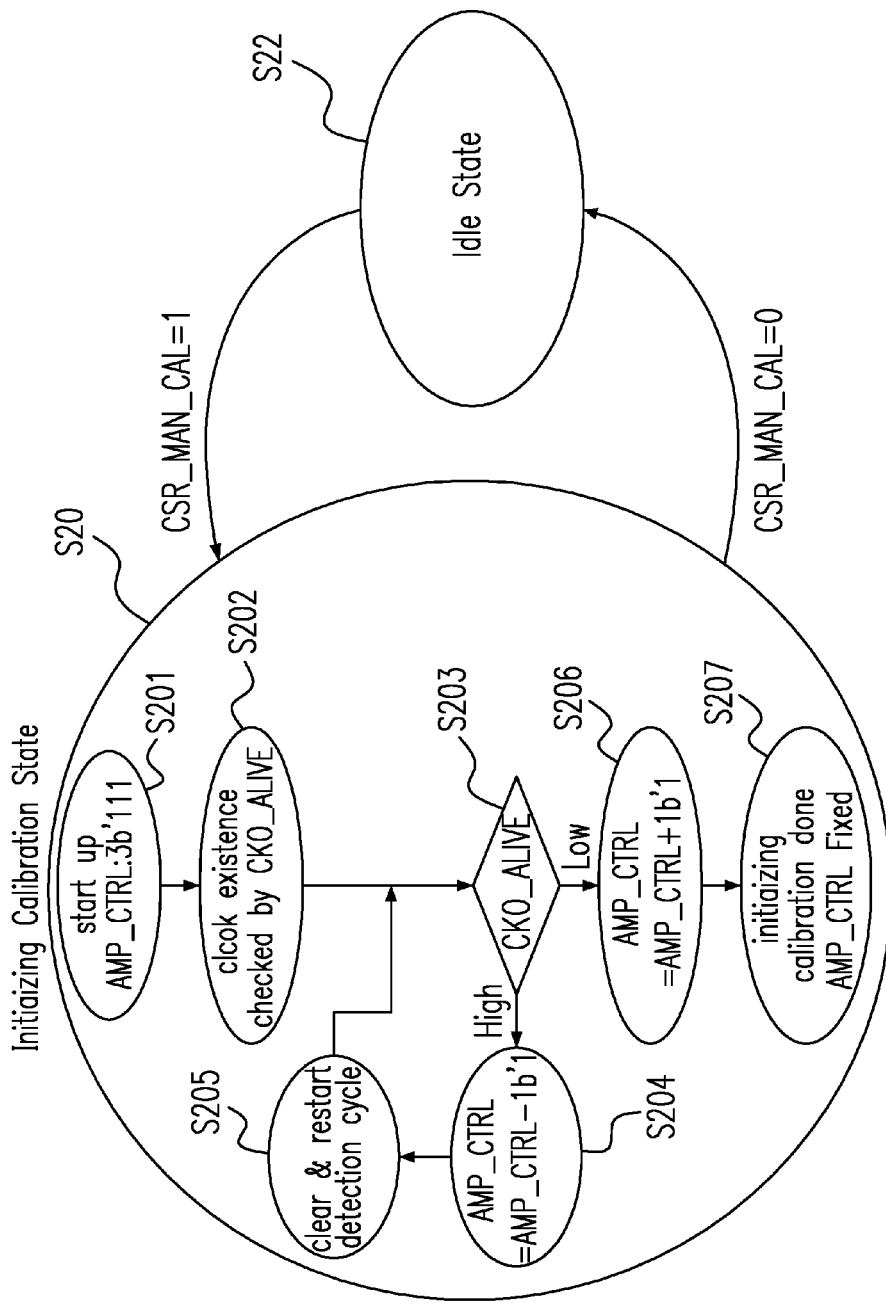
FIG. 15 shows an FSM state diagram of decreased power controlled by the FSM unit according to the preferred embodiment of the present disclosure.

Please refer to FIG. 15, which shows an FSM state diagram of decreased power controlled by the FSM unit 2032 according to the preferred embodiment of the present disclosure. In FIGS. 14 and 15, one condition must meet to go to an idle state S22 for the FSM unit 2032. It is that the message CKO_ALIVE indicating the clock signal CK3 is abnormal, then is normal again after a check period of time (the period of time t_adj6), then the calibration signal MAN_CAL is set to be in a low level state, and the FSM unit 2032 goes to be in the idle state S22. In some embodiment, when the power is on, the FSM unit 2032 will set the calibration signal MAN_CAL to be in a low level state and set the three-binary-bit value of the plurality of control signals AMP_CTRL <2:0> to be "111", and the initializing calibration process begins.

In FIG. 15, the state S20 is an initializing calibration state. In the state S201, the initializing calibration process starts up, the plurality of control signals AMP_CTRL <2:0> are set to one for all bits, and it shows a full power in FIG. 14 during the first detection cycle t_det1. In the state S202, the CED 2031 monitors the message CKO_ALIVE and the clock signal CK3 is checked by the message CKO_ALIVE. In the state S203, it is decided whether the message CKO_ALIVE indicating the status of the clock signal CK3 is high. If the message CKO_ALIVE shows a high level state, it indicates the clock signal CK3 is normal, and it still need to save power, so the calibration process is configured to have a state S204. In the state S204, the plurality of control signals AMP_CTRL <2:0> are used to digitally adjust the plurality of power source 201 by decreasing one step, i.e., from three binary bits "111" to "110", it shows one step power is subtracted as in FIG. 14 at the end of the first detection cycle t_det1, then the initializing calibration process is configured to have a state S205. In FIGS. 14 and 15, in the state S205, the first detection cycle t_det1 is cleared and the second detection cycle t_det2 is restarted. In the state S203, if the message CKO_ALIVE shows a low level state, then the initializing calibration process is configured to have a state S206. In the state S206, the power is adjusted by elevating one step, the plurality of control signals AMP_CTRL <2:0> are used to digitally adjust the plurality of power source 201 by elevating one step, i.e., from three binary bits "101" to "110", and the initializing process is configured to have a state S207. In the state S207, the initializing calibration is done and the plurality of control signals AMP_CTRL are fixed. In some embodiments, after the state S206, the initializing process can go to be in the state S205 and then detect whether the message CKO_ALIVE is in a high level state again. In the state S205, the third detection cycle t_det3 is cleared, and the fourth detection cycle t_det4 is restarted as shown in FIG. 14.

The present invention discloses an initialization and calibration of the clock signal by all digitized calibration module and method. The power adjustment and detection supplied to the amplifier are operated in all digitized method regardless the amplitude of the clock signal calibrated by the analog method and device. During a decreased power calibration, the clock signal starts faster, then is digitally calibrated to save power in the idle state. During an increasing power calibration, the clock signal is powered in an optimal method, i.e., the power provided to the clock signal is smallest and large enough to support its normal operation in the idle state. The all digitized calibration module and method is helpful to save more power than that of the analog calibration circuit. Thus the all digitized calibration module and method can improve the chip's power efficiency so as to prolong the battery life and the operating time.

Figure 16A:
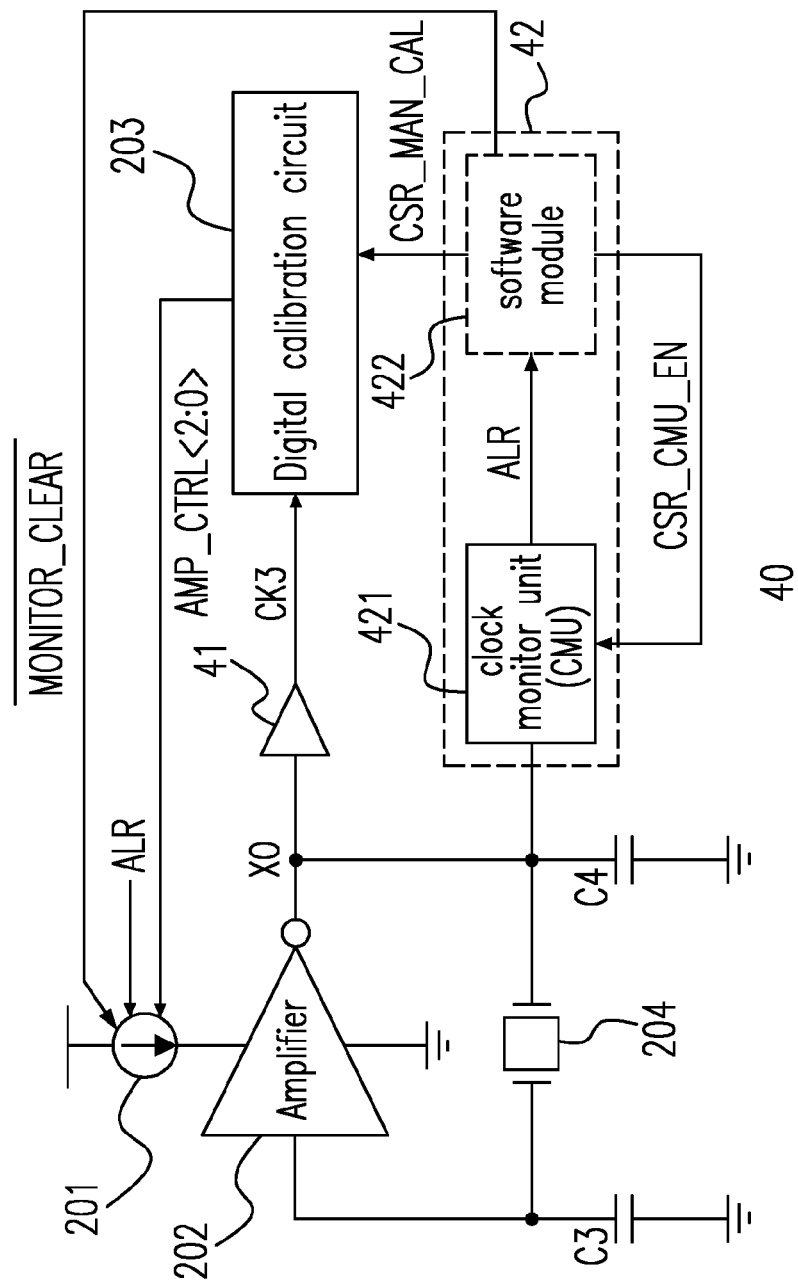
FIG. 16($a$) shows an oscillator module with a monitor circuit according to the preferred embodiment of the present disclosure.
Figure 16B:
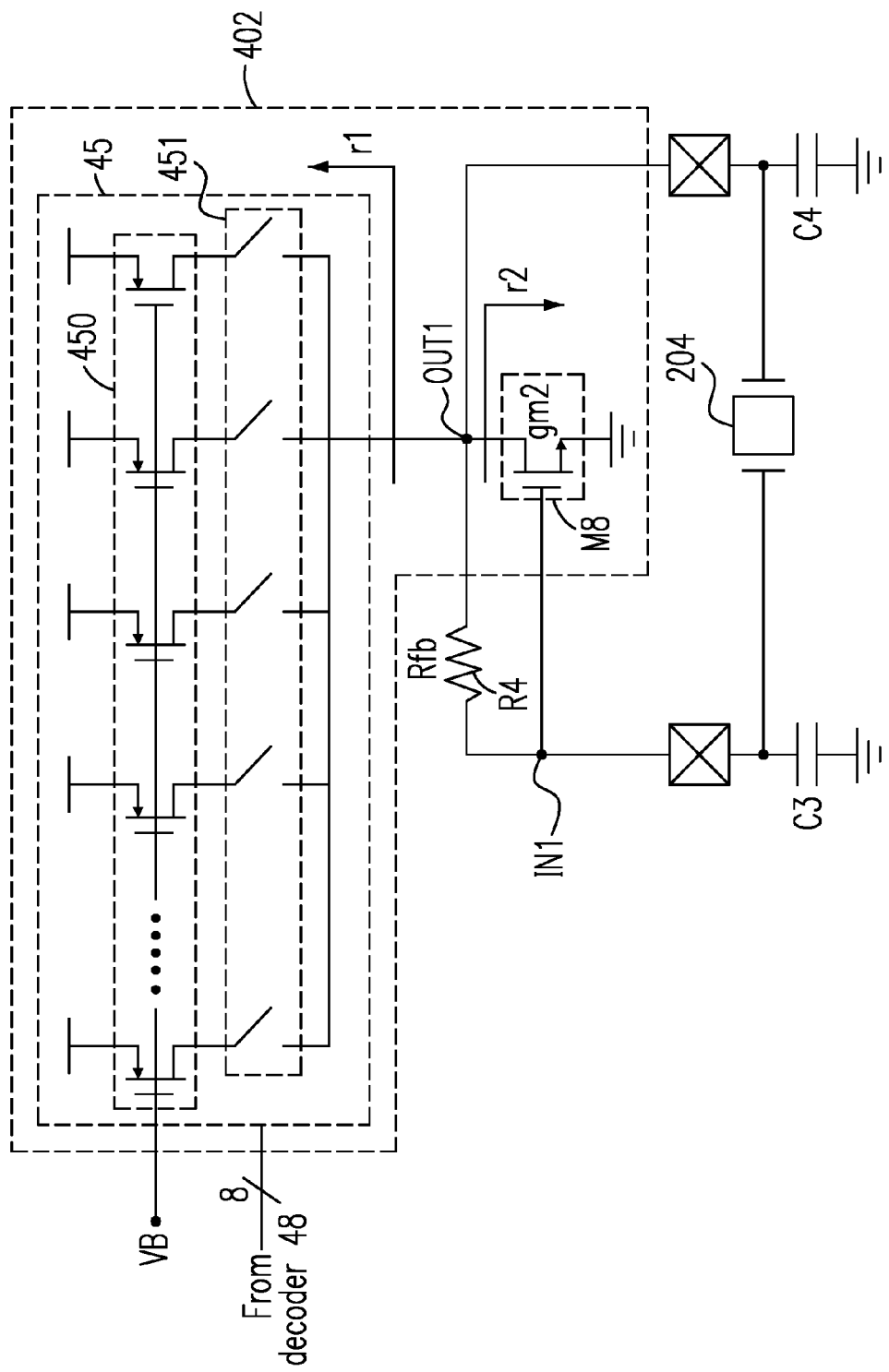

Please refer to FIG. 16(*a*), which shows an oscillator module 40 with a monitor circuit 42 according to the preferred embodiment of the present disclosure. The difference between the oscillator module 40 and the clock calibration module 20 in FIG. 5 is the monitor circuit 42, for example, the oscillator module 40 includes the monitor circuit 42, the clock calibration module 20 and a buffer 41, and the buffer 41 can strengthen the clock signal CK3. The clock calibration module 20 is used to calibrate the clock signal CK3 using the manual calibration signal CSR_MAN_CAL, while the monitor circuit 42 always detects whether the clock signal CK3 is normal or abnormal. When the clock signal CK3 is abnormal, the monitor circuit 42 will output the manual calibration signal CSR_MAN_CAL to calibrate the clock signal CK3, and thus the clock signal can recover from being abnormal automatically. On the contrary, if the monitor circuit 42 detects that the clock signal CK3 is normal, then the digital calibration circuit 203, which is all digitized circuit, powers down and enters the idle mode.

Please refer to FIG. 16(*b*), which shows an inverting amplifier 402 according to a preferred embodiment of the present disclosure. In some examples, the inverting amplifier 402 is a self-bias inverting amplifier including a NMOS transistor M8 and a PMOS current source load 45 coupled together where a feedback resistor R4 with resistance Rfb is connected between input IN1 and output OUT1 terminals of the inverting amplifier 402, the PMOS current source load 45 has a first equivalent inner resistance r1, the NMOS transistor M8 has a second equivalent trans-conductance gm2 and a second equivalent inner resistance r2, and if Rfb is much larger than r1 and r2, a voltage gain vo/vi of the amplifier is approximately equal to the following equation:

$$\frac{vo}{vi} = (gm1 + gm2) \times (r1 \mathbin{/\mkern-6mu/} r2) \tag{Eq 1}$$

In FIG. 16(*b*), the feedback resistor M8 is used to keep the inverting amplifier 402 in a linear amplified region. The PMOS current source load 45 includes a PMOS array 450 and a switch array 451 receiving signals from the decoder 48. In FIG. 16(*a*), the monitor circuit 42 is coupled between the digital calibration circuit 203 and the crystal resonator 204, and includes a clock monitor unit (CMU) 421 and a software module 422 electrically connected to the CMU 421. The CMU 421 monitors the clock signal CK3 to output an alarm signal ALR when the clock signal Ck3 is abnormal. The software module 422 outputs the manual calibration signal CSR_MAN_CAL in response to the alarm signal ALR, then activates the calibration process as in FIGS. 14 and 15. The plurality of power sources 201 are not only controlled by the plurality of control signals AMP_CTRL <2:0>, but are also controlled by the alarm signal ALR. In order to coordinate the alarm signal ALR and the plurality of control signals AMP_CTRL <2:0>, some components are required, for example, some logic gates and flip flops are added to control the plurality of power sources 201.

Figure 17:
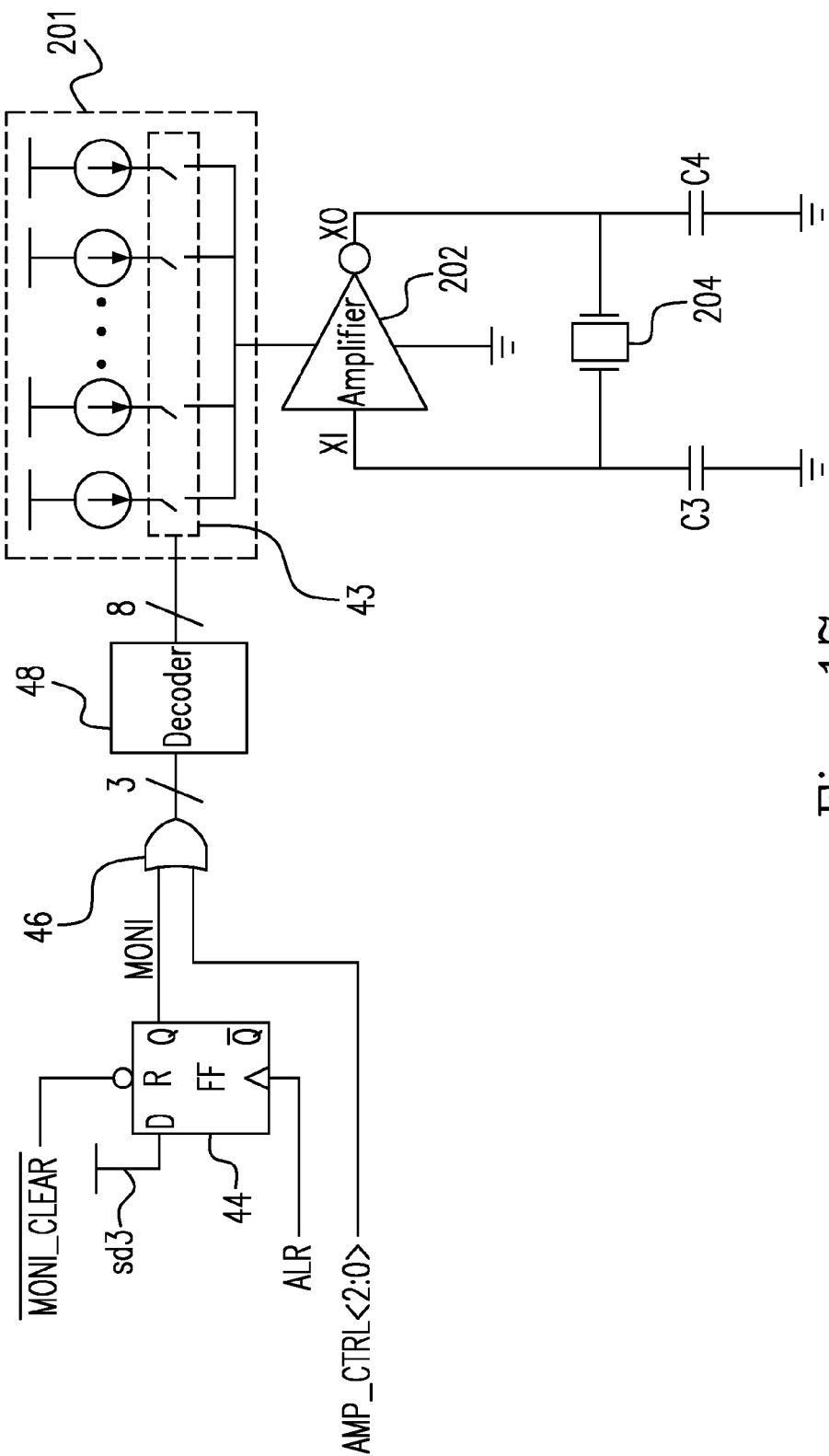
FIG. 17 shows a power control circuit according to the preferred embodiment of the present disclosure.
Figure 18:
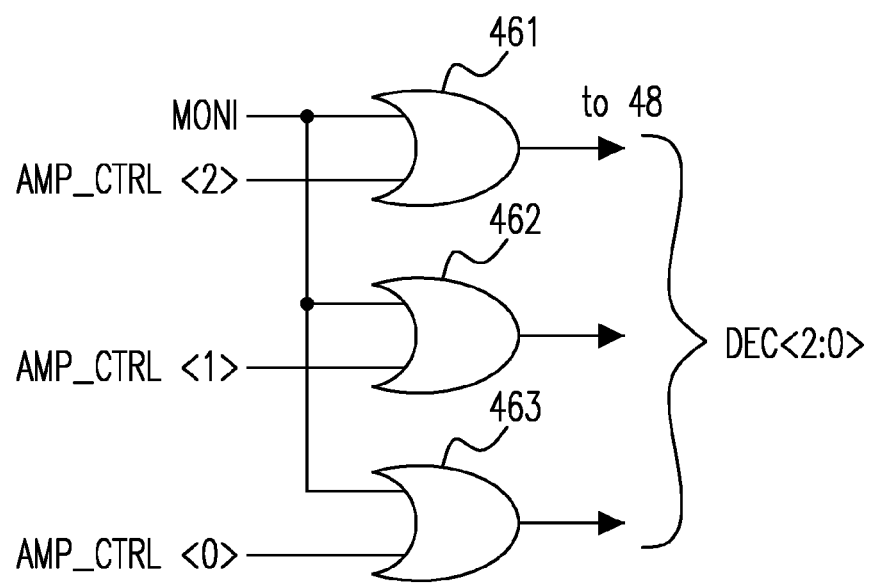
FIG. 18 shows a detail of the set of OR gates.

Please refer to FIG. 17, which shows a power control circuit according to the preferred embodiment of the present disclosure. The oscillator module 40 further includes a D flip flop circuit 44, a set of OR gates 46 and a decoder 48, which are included in the power control circuit. The detail of the set of OR gates is shown in FIG. 18, which indicates that the OR gates 461, 462 and 463 respectively output a plurality of decoding signals DEC <2:0> in response to the plurality of control signals AMP_CTRL <2>, AMP_CTRL <1> and AMP_CTRL <0>.

In some embodiments, please refer to FIGS. 16(*a*) and 17, when the CMU 421 outputs the alarm signal ALR to the D flip flop circuit 44 because the clock signal is abnormal, the D flip flop circuit 44, in response to the alarm signal ALR having a high level state, transmits a high level data sd3, and outputs a monitor signal MONI having the high level state. Please refer to FIG. 18, each of the OR gates 461, 462, 463 receives the monitor signal MONI, having the high level state, to output the plurality of decoding signals DEC <2:0> having a three binary bits "111", which indicates that all of the plurality of power sources are turned on because the clock signal CK3 fades out under such an emergency condition.

The decoder 48 can be a combination logic circuit having a truth table. Please refer to Table 1, which shows the truth table of the decoder 48. In some embodiments, it can be designed as the following.

TABLE 1

| DEC <2:0> | | | SW_CTRL <7:0> | | | | | | | |
|---|---|---|---|---|---|---|---|---|---|---|
| 0 | 0 | 0 | 0 | 0 | 0 | 0 | 0 | 0 | 0 | 1 |
| 0 | 0 | 1 | 0 | 0 | 0 | 0 | 0 | 0 | 1 | 1 |
| 0 | 1 | 0 | 0 | 0 | 0 | 0 | 0 | 1 | 1 | 1 |
| 0 | 1 | 1 | 0 | 0 | 0 | 0 | 1 | 1 | 1 | 1 |
| 1 | 0 | 0 | 0 | 0 | 0 | 1 | 1 | 1 | 1 | 1 |
| 1 | 0 | 1 | 0 | 0 | 1 | 1 | 1 | 1 | 1 | 1 |
| 1 | 1 | 0 | 0 | 1 | 1 | 1 | 1 | 1 | 1 | 1 |
| 1 | 1 | 1 | 1 | 1 | 1 | 1 | 1 | 1 | 1 | 1 |

In FIG. 17, the decoder 48 is coupled to the plurality of MOS switches 43, and in response to the plurality of decoding signals DEC <2:0>, controls the plurality of MOS switches 43 by using a plurality of switch control signals SW_CTRL <7:0> individually. The plurality of MOS switches 43 can be implemented using NMOS or PMOS switches. Please refer to FIG. 17 and Table 1, when the clock signal CK3 is abnormal, the plurality of decode signals DEC <2:0> will be equal to three binary bits "111", therefore the decoder 48 output the plurality of switch control signals SW_CTRL <7:0> being equal to eight binary bits "11111111", which will turn on all of the plurality of MOS switches 43, and thus all of the plurality of power sources can provide the inverting amplifier 202 with full power.

Then, a monitor clear signal MONI_CLEAR_bar from the software module 422 resets the D flip flop circuit 44 to output the monitor signal MONI having a low level state after the alarm signal ALR occurs. Subsequently, the software module 422 sends CSR_MAN_CAL to invoke the digital calibration circuit 203. The digital calibration circuit 203 can activate the calibration process as in FIGS. 6 and 7(a)-(b) or in FIGS. 14 and 15, i.e., increase or decrease power to more optimal one. In FIG. 18, each of the OR gates 461, 462, 463 ignore the monitor signal MONI and pass through the plurality of control signals AMP_CTRL <2:0> to the decoder 48. For the decreasing-power case, it can be "110" after "111" is received by the decoder 48. The decoder 48 then outputs the plurality of switch control signals SW_CTRL <7:0> being equal to "01111111" according to the Table 1, and thus turns on seven MOS switches among the plurality of MOS switches 43 respectively. If there is a level transition of the message CKO_ALIVE, then the plurality of switch control signals SW_CTRL <7:0> change to "00111111" by decreasing power by one step. If there is no level transition of the message CKO_ALIVE as shown in third detection cycle t_det3 of FIG. 14, then the plurality of switch control signals SW_CTRL <7:0> changes back to "01111111" by increasing power by one step. In this way, the clock signal can not only operate in an optimal saving-power status, but can also be calibrated automatically whenever the clock signal is abnormal.

In some embodiments, it may prefer to switch to a second system clock source CK_SYSTEM as in FIG. 7(a) while the clock signal CK3 is being calibrated, and switch back to the clock signal CK3 after the clock calibration is complete. Because the clock calibration procedure may take some time, this can guarantee a providing system clock to be stable, and then shut down the second system clock source CK_SYSTEM to save power.

Figure 19:
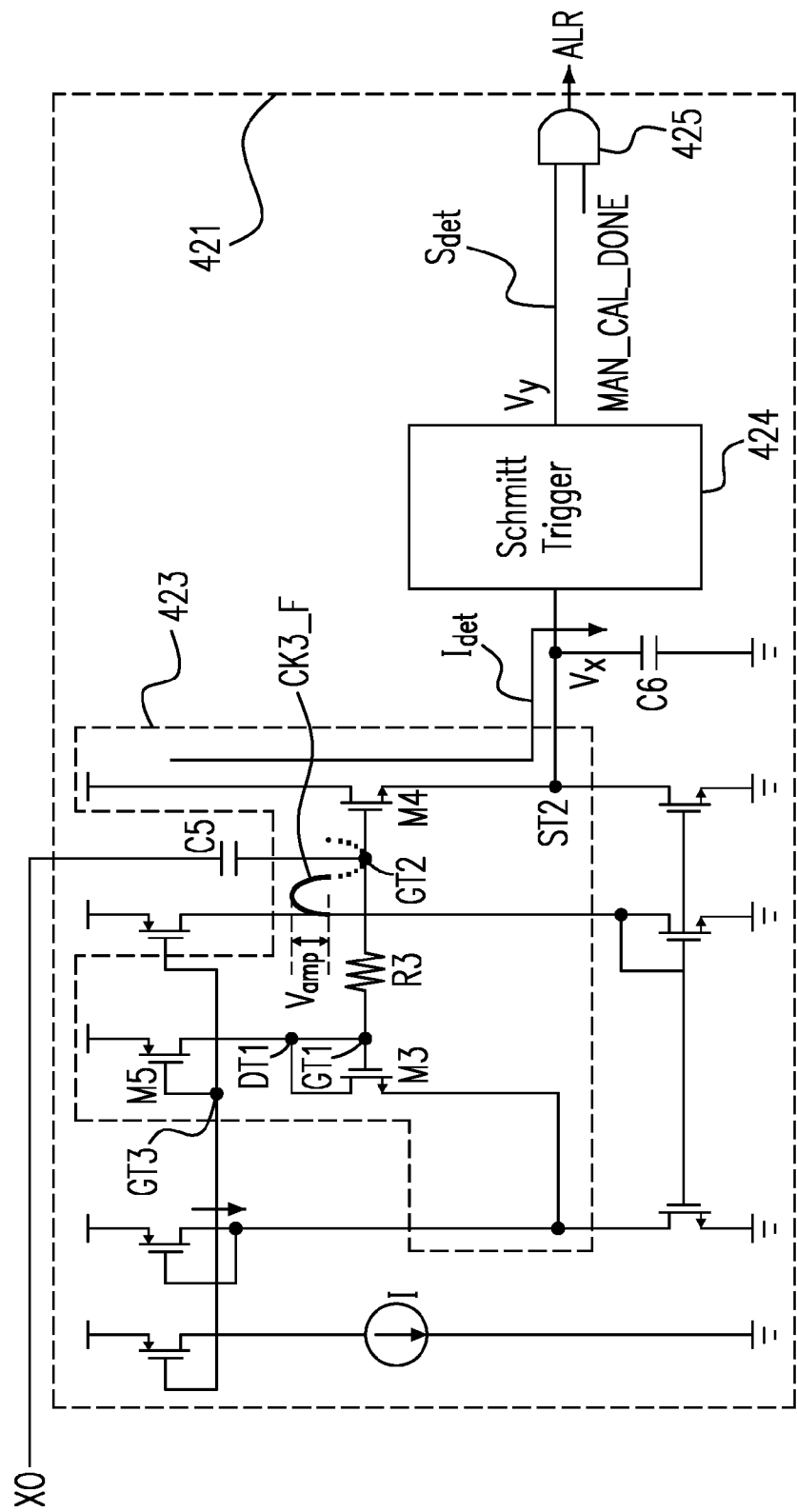
FIG. 19 shows the CMU in detail according to the preferred embodiment of the present disclosure.

Please refer to FIG. 19, which shows the CMU 421 in detail according to the preferred embodiment of the present disclosure. In FIG. 19, the CMU 421 includes a first current mirror 423. The first current mirror 423 includes a P channel metal oxide semi-conductor (PMOS) transistor M5, a first NMOS transistor M3 and a second NMOS transistor M4. The first NMOS transistor M3 has a gate terminal GT1 electrically connected to a drain terminal DT1 of the first NMOS M3 and a drain terminal of the PMOS M5. Each gate terminal GT1, GT2 of the first and the second NMOS transistors M3, M4 is electrically connected to a resistor R3, the clock signal CK3 is coupled to the gate terminal GT2 of the second NMOS transistor M4 via a first capacitor C5, and a second capacitor C6 is coupled to a source terminal ST2 of the second NMOS transistor M4.

In FIG. 19, the resistor R3 and the first capacitor C5 form a filter circuit to eliminate low frequency noise from the clock signal CK3 to generate a filtered clock signal CK3_F. During the positive cycle of the filtered clock signal CK3_F, the second NMOS transistor is turned on because the filtered clock signal CK3_F has a positive amplitude which has a peak value Vamp, and then the current Idet flows through the second NMOS transistor and the second capacitor C6, and charges the second capacitor to a peak voltage Vx. During the negative cycle of the filtered clock signal CK3_F, the second NMOS transistor M4 is turned off, and the second capacitor C6 sustains the peak voltage Vx. If the peak voltage Vx drops below a predetermined threshold VTHL, the Schmitt trigger unit 424, in response to this change, outputs a detected signal Sdet having a voltage Vy as shown in FIGS. 19 and 20.

Figure 20:
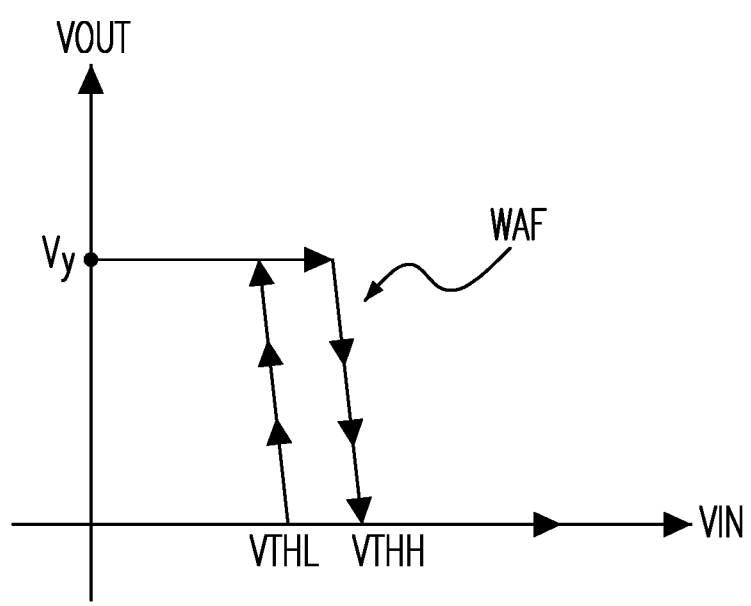
FIG. 20 shows characteristic waveform of the schmitt trigger unit according to the preferred embodiment of the present disclosure.

Please refer to FIG. 20, which shows the characteristic waveform of the Schmitt trigger unit 424 according to the preferred embodiment of the present disclosure. The horizontal axis represents an input voltage VIN of the Schmitt trigger unit 424, and the vertical axis represents an output voltage VOUT of the Schmitt trigger unit 424. The waveform WAF indicates that the Schmitt trigger unit 424 is a bi-stable component, and the predetermined threshold VTHL and VTHH are near the middle level of the logic level range, for example, if the logic level ranges from 0 to 5 volts, the predetermined threshold VTHL may be 2 volts and the predetermined threshold VTHH may be 3 volts. This can prevent the CMU 421 from a false alarm because the noise from the clock signal CK3 near the middle level will be filtered out.

In FIG. 19, an AND gate 425 receives the detected signal Sdet and a calibration complete signal MAN_CAL_DONE from the digital calibration circuit 203 to output the alarm signal ALR. The software module 422 is coupled to the CMU 421, and receives the alarm signal ALR to output the manual calibration signal CSR_MAN_CAL. Because the calibration operation and the monitor operation of the clock signal CK3 are combined together, there is a need to separate these two operations from a conflict. For this purpose, the calibration complete signal MAN_CAL_DONE from the digital calibration circuit 203 can be used to enable or disable the alarm signal ALR depending on its high level state or low level state. Please refer to FIGS. 7 and 19, when the calibration operation is performed, the calibration complete signal MAN_CAL_DONE has a low level state, so the AND gate 425 is disabled, and the alarm signal ALR is in a low level state, which will not interfere with the calibration operation. Once the calibration operation is completed, the calibration complete signal MAN_CAL_DONE has a high level state, so the alarm signal ALR is outputted from the AND gate 425 depending on the detected signal Sdet. In some embodiments, the software module 422 can also output an enable signal CSR CMU EN to enable the CMU 421 when the software module 422 receives the calibration complete signal MAN_CAL_DONE.

Figure 21:
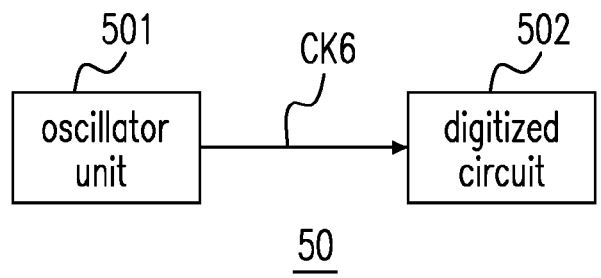
FIG. 21 shows an oscillator module according to the preferred embodiment of the present disclosure.

Please refer to FIG. 21, which shows an oscillator module 50 according to the preferred embodiment of the present disclosure. The oscillator module 50 comprises an oscillator unit 501 and a digitized circuit 502. The oscillator unit 501 generates a clock signal CK6. The digitized circuit 502 digitally detecting whether the clock signal CK6 is normal, wherein if the clock signal CK6 is normal, the digitized circuit 502 idles itself and the oscillator module 50 monitors whether the clock signal CK6 remains normal.

Figure 22:
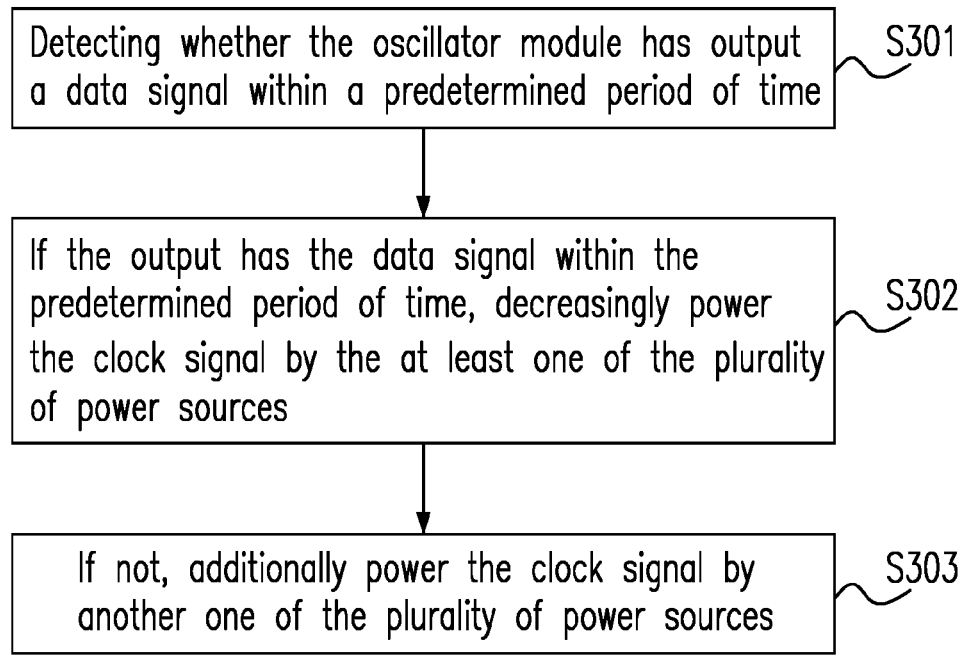
FIG. 22 shows a method of initializing an oscillator module generating a clock signal to be used with a plurality of power sources coupled to a plurality of amplifiers respectively.

Please refer to FIG. 22, which shows a method of initializing an oscillator module generating a clock signal to be used with a plurality of power sources coupled to a plurality of amplifiers respectively, and the method comprises step S301: detecting whether the oscillator module has output a data signal within a predetermined period of time, wherein step S302: if the output has the data signal within the predetermined period of time, decreasingly power the clock signal by the at least one of the plurality of power sources; step S303: if not, additionally power the clock signal by another one of the plurality of power sources.

Embodiments

1. An oscillator module used with a plurality of power sources, comprising an oscillator unit, a clock monitor unit (CMU), a software module and a digital calibration circuit. The oscillator unit generates a clock signal. The CMU is coupled to the oscillator unit, determines whether an amplitude of the clock signal exceeds a predetermined threshold, and outputs an alarm signal if the amplitude of the clock signal is lower than the predetermined threshold. The software module is coupled to the CMU, and receives the alarm signal to output a calibration signal. The digital calibration circuit is coupled to the oscillator and the software module, outputs a control signal in response to the clock signal and the calibration signal, adjusts the plurality of power sources to modify the clock signal.

2. The module in Embodiment 1, wherein the CMU includes a first current mirror, a schmitt trigger unit and an AND gate. The first current mirror includes a first P channel metal oxide semi-conductor (PMOS) transistor, a first n channel metal oxide semiconductor (NMOS) transistor and a second NMOS transistor, wherein the first NMOS transistor has a gate terminal electrically connected to a drain terminal of the first NMOS and a drain terminal of the first PMOS, the gate terminals of the first and the second NMOS transistors are electrically connected to a resistor, the clock signal is transmitted to the gate terminal of the second NMOS transistor via a first capacitor, and a second capacitor is coupled to a source terminal of the second NMOS transistor. The resistor and the first capacitor form a filter circuit to eliminate low frequency noise from the clock signal to generate a filtered clock signal. The second NMOS transistor, in response to the filtered clock signal, generates a voltage sustained by the second capacitor. The schmitt trigger unit is coupled to the first current mirror and receives the voltage to output a detected signal. The AND gate is coupled to the schmitt trigger unit and the digital calibration circuit, and receives the detected signal and a calibration complete signal from the schmitt trigger unit and the digital calibration circuit respectively to output the alarm signal.

3. The module of any one of Embodiments 1-2, wherein the plurality of power sources are a plurality of current sources electrically connected to a plurality of MOS switches respectively. The oscillator module further includes a D flip flop circuit, a set of OR gates and a decoder. The D flip flop circuit receiving a data signal having a high level state, the alarm signal from the CMU and a monitor clear signal from the software module to output a monitor signal. The set of OR gates, each of which receives the monitor signal and one of a plurality of control signals from the digital calibration circuit to output a plurality of decoding signals. The decoder is coupled to the plurality of MOS switches, and controls the plurality of MOS switches in response to the plurality of decoding signals individually.

4. The module of any one of Embodiments 1-3, wherein the oscillator module further includes an amplifier, a crystal resonator, a first load capacitor and a second load capacitor. The amplifier having an input terminal and an output terminal, receives a first pre-oscillation signal and a current which is from the plurality of power sources, and outputs a second pre-oscillation signal having a phase equal to minus 180 degrees of the first pre-oscillation signal. The crystal resonator is coupled to the input terminal and the output terminal, and provides the clock signal to the digital calibration circuit via the output terminal. The first load capacitor is coupled to the input terminal and a ground terminal. The second load capacitor is coupled to the output terminal and the ground terminal.

5. The module of any one of Embodiments 1-4, wherein the amplifier is a self-bias inverting amplifier including a NMOS transistor and a PMOS current source load coupled together where a feedback resistor with resistance Rfb is connected between input and output terminal of the amplifier, the PMOS current source load has a first equivalent inner resistance r1, the NMOS transistor has a second equivalent trans-conductance gm2 and a second equivalent inner resistance r2, and if Rfb is much larger than r1 and r2, a voltage gain vo/vi of the amplifier is approximately equal to the following equation:

$$\frac{vo}{vi} = (gm1 + gm2) \times (r1 \mathbin{/\mkern-6mu/} r2)$$

6. The module of any one of Embodiments 1-5, wherein the digital calibration circuit includes a clock existence detector (CED) and a state machine unit. The CED receives the clock signal, and outputs a data signal when the data signal of the CED transits from a first output level to a second output level. The state machine unit is coupled to the CED, and detects whether the data signal from the CED has the second output level, wherein if the CED has the second level, the state machine keeps the clock signal at the amplitude; and if not, the state machine additionally powers the clock signal by another one of the plurality of power sources.

7. The module of any one of Embodiments 1-6, wherein the software module enables the CMU when the software module receives a calibration complete signal.

8. An oscillator module comprises an oscillator unit and a digitized circuit. The oscillator unit generates a clock signal. The digitized circuit is coupled to the oscillator unit and digitally detects whether the clock signal is normal, wherein if the clock signal is normal, the digitized circuit idles itself; and if not, the digitized circuit is activated digitally.

9. The module in Embodiment 8, wherein the oscillator module is used with a plurality of power sources. The oscillator module further includes a monitor circuit coupled to the oscillator unit, and detecting whether the clock signal is acceptable. The digitized circuit further comprises a digital calibration circuit coupled to the monitor circuit, wherein if the clock signal is acceptable, the monitor circuit idles the digital calibration circuit and monitors whether the clock signal remains acceptable; and if not, the monitor circuit activates the digital calibration circuit.

10. The module of any one of Embodiments 8-9, wherein the oscillator module further includes a software module. The monitor circuit determines whether an amplitude of the clock signal exceeds a predetermined threshold, and outputs an alarm signal if negative. The software module receives the alarm signal to output a calibration signal. The digital calibration circuit outputs a plurality of control signals in response to the clock signal and the calibration signal, wherein the plurality of control signals adjust the plurality of power sources respectively to modify the clock signal.

11. The module of any one of Embodiments 8-10, wherein the monitor circuit includes a filter circuit filtering the clock signal to eliminate low frequency noise therefrom. The monitor circuit includes a first MOS transistor detecting the amplitude of the filtered clock signal during its positive cycle. The monitor circuit idles the digital calibration circuit when the amplitude of the filtered clock signal reaches the predetermined threshold.

12. The module of any one of Embodiments 8-11, wherein the oscillator module further includes a clock monitor unit (CMU) having a voltage detector and a current mirror including a second MOS transistor converting the amplitude of the clock signal to a detected voltage. The voltage detector maintains the detected voltage.

13. The module of any one of Embodiments 8-12, wherein the oscillator module includes a clock monitor unit (CMU) including a schmitt trigger unit and an AND gate. The schmitt trigger unit digitally inverts a logic level of the amplitude of the clock signal when the amplitude of the clock signal is below the predetermined threshold. The AND gate outputs the alarm signal in response to the inverted logic level and a calibration complete signal from the digital calibration circuit.

14. The module of any one of Embodiments 8-13, wherein the plurality of power sources are coupled to a plurality of switches respectively. The oscillator module further includes a D flip flop circuit, a set of OR gates and a decoder. The monitor circuit triggers the D flip flop circuit to output a monitor signal having a high level state when the alarm signal occurs. Regardless of the plurality of control signals from the digital calibration circuit, the monitor signal having the high level state individually triggers the sets of OR gates to output a set of decoding signals. The decoder decodes the set of decoding signals to output a plurality of switch control signals. The plurality of switch control signals adjust the plurality of power sources respectively by turning on all of the plurality of switches 15. The module of any one of Embodiments 8-14, wherein a monitor clear signal from the software module resets the D flip flop circuit to output the monitor signal having a low level state after the alarm signal occurs. The plurality of control signals from the digital calibration circuit respectively adjust the plurality of power sources by one of turning on and off at least one of the plurality of switches. The set of OR gates keeps the plurality of power sources controlled by the plurality of control signals from the digital calibration circuit respectively when the alarm signal does not occur.

16. An oscillator module comprises an oscillator unit and a digitized circuit. The oscillator unit generates a clock signal. The digitized circuit digitally detecting whether the clock signal is normal, wherein if the clock signal is normal, the digitized circuit idles itself and the oscillator module monitors whether the clock signal remains normal.

17. The module in Embodiments 16, wherein the oscillator module is used with a plurality of power sources. The oscillator module further includes a monitor circuit coupled to the oscillator unit and detecting whether the clock signal is acceptable. The digitized circuit further comprises a digital calibration circuit coupled to the monitor circuit, wherein if the clock signal is acceptable, the monitor circuit idles the digital calibration circuit and monitors whether the clock signal remains acceptable; and if not, the monitor circuit activates the digital calibration circuit.

18. The module of any one of Embodiments 16-17, wherein the CMU includes a first current mirror, a schmitt trigger unit and an AND gate. The first current mirror includes a first P channel metal oxide semi-conductor (PMOS) transistor, a first n channel metal oxide semiconductor (NMOS) transistor and a second NMOS transistor, wherein the first NMOS transistor has a gate terminal electrically connected to a drain terminal of the first NMOS and a drain terminal of the first PMOS, the gate terminals of the first and the second NMOS transistors are electrically connected to a resistor, the clock signal is transmitted to the gate terminal of the second NMOS transistor via a first capacitor, and a second capacitor is coupled to a source terminal of the second NMOS transistor. The resistor and the first capacitor form a filter circuit to eliminate low frequency noise from the clock signal to generate a filtered clock signal. The second NMOS transistor, in response to the filtered clock signal, generates a voltage sustained by the second capacitor. The schmitt trigger unit is coupled to the first current mirror and receives the voltage to output a detected signal. The AND gate is coupled to the schmitt trigger unit and the digital calibration circuit, and receives the detected signal and a calibration complete signal from the schmitt trigger unit and the digital calibration circuit respectively to output the alarm signal.

19. The module of any one of Embodiments 16-18, wherein wherein the plurality of power sources are a plurality of current sources electrically connected to a plurality of MOS switches respectively. The oscillator module further includes a D flip flop circuit, a set of OR gates and a decoder. The D flip flop circuit receiving a data signal having a high level state, the alarm signal from the CMU and a monitor clear signal from the software module to output a monitor signal. The set of OR gates, each of which receives the monitor signal and one of a plurality of control signals from the digital calibration circuit to output a plurality of decoding signals. The decoder is coupled to the plurality of MOS switches, and controls the plurality of MOS switches in response to the plurality of decoding signals individually.

20. The module of any one of Embodiments 16-19, wherein when the alarm signal having a high level state triggers the D flip flop circuit, the D flip flop circuit outputs the monitor signal having the high level state, the set of OR gates output the plurality of decoding signals having the high level state in response to a transition from a low level state to the high level state, and the decoder turns on all of the plurality of MOS switches to recover the clock signal. When the alarm signal has a low level state, the D flip flop circuit outputs the monitor signal having an unchanged level state, the set of OR gates output the plurality of decoding signals having the same states as those of the plurality of control signals in response to the digital calibration circuit, and the decoder control the plurality of MOS switches to calibrate the clock signal when the digital calibration circuit is triggered by a calibration signal from the monitor circuit; and the digital calibration circuit includes a clock existence detector (CED) and a state machine unit. The CED receives the clock signal, and outputs a data signal when the data signal of the CED transits from a first output level to a second output level. The state machine unit is coupled to the CED, and detects whether the CED has the second output level, wherein if the CED has the second level, the state machine keeps the clock signal at the same amplitude; and if not, the state machine additionally powers the clock signal using another one of the plurality of power sources.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. An oscillator module used with a plurality of power sources, comprising:
   an oscillator unit generating a clock signal;
   a clock monitor unit (CMU) coupled to the oscillator unit, determining whether an amplitude of the clock signal exceeds a predetermined threshold, and outputting an alarm signal if the amplitude of the clock signal is lower than the predetermined threshold;
   a software module coupled to the CMU, and receiving the alarm signal to output a calibration signal; and
   a digital calibration circuit coupled to the oscillator and the software module, outputting a control signal in response to the clock signal and the calibration signal, adjusting the plurality of power sources to modify the clock signal,
   wherein the CMU includes:
      a first current mirror including a first P channel metal oxide semi-conductor (PMOS) transistor, a first n channel metal oxide semiconductor (NMOS) transistor and a second NMOS transistor, wherein:
         the first NMOS transistor has a gate terminal electrically connected to a drain terminal of the first NMOS and a drain terminal of the first PMOS, the gate terminals of the first and the second NMOS transistors are electrically connected to a resistor, the clock signal is transmitted to the gate terminal of the second NMOS transistor via a first capacitor, and a second capacitor is coupled to a source terminal of the second NMOS transistor;
         the resistor and the first capacitor form a filter circuit to eliminate low frequency noise from the clock signal to generate a filtered clock signal; and
         the second NMOS transistor, in response to the filtered clock signal, generates a voltage sustained by the second capacitor;
      a schmitt trigger unit coupled to the first current mirror and receiving the voltage to output a detected signal; and
      an AND gate coupled to the Schmitt trigger unit and the digital calibration circuit, and receiving the detected signal and a calibration complete signal from the Schmitt trigger unit and the digital calibration circuit respectively to output the alarm signal.

2. The oscillator module as in claim 1, wherein:
   the plurality of power sources are a plurality of current sources electrically connected to a plurality of MOS switches respectively;
   the oscillator module further includes:
      a D flip flop circuit receiving a data signal having a high level state, the alarm signal from the CMU and a monitor clear signal from the software module to output a monitor signal;
      a set of OR gates, each of which receives the monitor signal and one of a plurality of control signals from the digital calibration circuit to output a plurality of decoding signals; and
      a decoder coupled to the plurality of MOS switches, and controlling the plurality of MOS switches in response to the plurality of decoding signals individually.

3. The oscillator module as in claim 1, wherein:
   the oscillator module further includes:
      an amplifier having an input terminal and an output terminal, receiving a first pre-oscillation signal and a current which is from the plurality of power sources, and outputting a second pre-oscillation signal having a phase equal to minus 180 degrees of the first pre-oscillation signal;
      a crystal resonator coupled to the input terminal and the output terminal, and providing the clock signal to the digital calibration circuit via the output terminal;
      a first load capacitor coupled to the input terminal and a ground terminal; and
      a second load capacitor coupled to the output terminal and the ground terminal.

4. The oscillator module as in claim 1, wherein the digital calibration circuit includes:
   a clock existence detector (CED) receiving the clock signal, and outputting a data signal when the data signal of the CED transits from a first output level to a second output level; and
   a state machine unit coupled to the CED, and detecting whether the data signal from the CED has the second output level, wherein:
      if the CED has the second level, the state machine keeps the clock signal at the amplitude; and
      if not, the state machine additionally powers the clock signal by another one of the plurality of power sources.

5. The oscillator module as in claim 1, wherein the software module enables the CMU when the software module receives a calibration complete signal.

6. An oscillator module, comprising:
   an oscillator unit generating a clock signal; and
   a digitized circuit coupled to the oscillator unit and digitally detecting whether the clock signal is normal, wherein if the clock signal is normal, the digitized circuit idles itself; and if not, the digitized circuit is activated digitally, wherein:
   the oscillator module is used with a plurality of power sources;
   the oscillator module further includes a monitor circuit coupled to the oscillator unit, and detecting whether the clock signal is acceptable;
   the digitized circuit further comprises a digital calibration circuit coupled to the monitor circuit, wherein:

if the clock signal is acceptable, the monitor circuit idles the digital calibration circuit and monitors whether the clock signal remains acceptable; and if not, the monitor circuit activates the digital calibration circuit, and the oscillator module further includes a software module;

the monitor circuit determines whether an amplitude of the clock signal exceeds a predetermined threshold, and outputs an alarm signal if negative;

the software module receives the alarm signal to output a calibration signal;

the digital calibration circuit outputting a plurality of control signals in response to the clock signal and the calibration signal, wherein the plurality of control signals adjust the plurality of power sources respectively to modify the clock signal;

the monitor circuit includes a filter circuit filtering the clock signal to eliminate low frequency noise therefrom;

the monitor circuit includes a first MOS transistor detecting the amplitude of the filtered clock signal during its positive cycle; and the monitor circuit idles the digital calibration circuit when the amplitude of the filtered clock signal reaches the predetermined threshold.

7. The module as in claim 6, wherein:

the oscillator module further includes a clock monitor unit (CMU) having a voltage detector and a current mirror including a second MOS transistor converting the amplitude of the clock signal to a detected voltage; and the voltage detector maintains the detected voltage.

8. The module as in claim 6, wherein:

the oscillator module includes a clock monitor unit (CMU) including a schmitt trigger unit and an AND gate:

the schmitt trigger unit digitally inverts a logic level of the amplitude of the clock signal when the amplitude of the clock signal is below the predetermined threshold; and the AND gate outputs the alarm signal in response to the inverted logic level and a calibration complete signal from the digital calibration circuit.

9. The module as in claim 6, wherein:

the plurality of power sources are coupled to a plurality of switches respectively;

the oscillator module further includes a D flip flop circuit, a set of OR gates and a decoder;

the monitor circuit triggers the D flip flop circuit to output a monitor signal having a high level state when the alarm signal occurs;

regardless of the plurality of control signals from the digital calibration circuit, the monitor signal having the high level state individually triggers the sets of OR gates to output a set of decoding signals;

the decoder decodes the set of decoding signals to output a plurality of switch control signals; and the plurality of switch control signals adjust the plurality of power sources respectively by turning on all of the plurality of switches.

10. The module as in claim 9, wherein:

a monitor clear signal from the software module resets the D flip flop circuit to output the monitor signal having a low level state after the alarm signal occurs; and the plurality of control signals from the digital calibration circuit respectively adjust the plurality of power sources by one of turning on and off at least one of the plurality of switches; and the set of OR gates keeps the plurality of power sources controlled by the plurality of control signals from the digital calibration circuit respectively when the alarm signal does not occur.

11. An oscillator module, comprising:

an oscillator unit generating a clock signal; and a digitized circuit digitally detecting whether the clock signal is normal, wherein if the clock signal is normal, the digitized circuit idles itself and the oscillator module monitors whether the clock signal remains normal, wherein:

the oscillator module is used with a plurality of power sources;

the oscillator module further includes a monitor circuit coupled to the oscillator unit and detecting whether the clock signal is acceptable; and the digitized circuit further comprises a digital calibration circuit coupled to the monitor circuit, wherein:

if the clock signal is acceptable, the monitor circuit idles the digital calibration circuit and monitors whether the clock signal remains acceptable; and if not, the monitor circuit activates the digital calibration circuit, and the monitor circuit includes:

a clock monitor unit (CMU) including a first current mirror includes a P channel metal oxide semi-conductor (PMOS) transistor, a first NMOS transistor and a second NMOS transistors, wherein:

the first NMOS transistor has a gate terminal electrically connected to a drain terminal of the first NMOS and a drain terminal of the PMOS, each gate terminal of the first and the second NMOS transistors are electrically connected to a resistor, the clock signal is coupled to the gate terminal of the second NMOS transistor via a first capacitor, and a second capacitor is coupled to a source terminal of the second NMOS transistor;

the resistor and the first capacitor form a filter circuit to eliminate low frequency noises from the clock signal to generate a filtered clock signal; and the second NMOS transistor in response to the filtered clock signal, generates a voltage sustained by the second capacitor;

a schmitt trigger unit coupled to the first current mirror and receiving the voltage to output a detected signal; and an AND gate coupled to the schmitt trigger unit and the digital calibration circuit, and receiving the detected signal and a calibration complete signal being from the schmitt trigger unit and the digital calibration circuit respectively to output the alarm signal.

12. The module as in claim 11, wherein:

the plurality of power sources are a plurality of current sources electrically connected to a plurality of MOS switches respectively;

the oscillator module further includes:

a D flip flop circuit receiving a data signal having a high level state, the alarm signal from the CMU and a monitor clear signal from the software module to output a monitor signal;

a set of OR gates, each of which receives the monitor signal and one of a plurality of control signals from the digital calibration circuit to output a plurality decoding signals; and a decoder coupled to the plurality of MOS switches, and controlling the plurality of MOS switches individually in response to the plurality of decoding signals.

13. The method as in claim 11, wherein:
- when the alarm signal having a high level state triggers the D flip flop circuit, the D flip flop circuit outputs the monitor signal having the high level state, the set of OR gates output the plurality of decoding signals having the high level state in response to a transition from a low level state to the high level state, and the decoder turns on all of the plurality of MOS switches to recover the clock signal; and
- when the alarm signal has a low level state, the D flip flop circuit outputs the monitor signal having an unchanged level state, the set of OR gates output the plurality of decoding signals having the same states as those of the plurality of control signals in response to the digital calibration circuit, and the decoder control the plurality of MOS switches to calibrate the clock signal when the digital calibration circuit is triggered by a calibration signal from the monitor circuit; and
- the digital calibration circuit includes:
  - a clock existence detector (CED) receiving the clock signal, and outputting a data signal when the data signal of the CED transits from a first output level to a second output level; and
  - a state machine unit coupled to the CED, and detecting whether the CED has the second output level, wherein:
    - if the CED has the second level, the state machine keeps the clock signal at the same amplitude; and
    - if not, the state machine additionally powers the clock signal using another one of the plurality of power sources.

* * * * *